(12) United States Patent
Takahashi et al.

(10) Patent No.: US 10,133,374 B2
(45) Date of Patent: Nov. 20, 2018

(54) METHOD OF MANUFACTURING COVER GLASS, COVER GLASS AND COVER GLASS-EQUIPPED DISPLAY DEVICE

(71) Applicant: Dai Nippon Printing Co., Ltd., Tokyo (JP)

(72) Inventors: Shinichiro Takahashi, Tokyo (JP); Akiyoshi Uchida, Tokyo (JP); Shinichi Sakano, Tokyo (JP); Minoru Nakanishi, Tokyo (JP); Shinsuke Nakazawa, Tokyo (JP); Satoshi Emori, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 340 days.

(21) Appl. No.: 15/029,863

(22) PCT Filed: Oct. 23, 2014

(86) PCT No.: PCT/JP2014/078244
§ 371 (c)(1),
(2) Date: Apr. 15, 2016

(87) PCT Pub. No.: WO2015/060395
PCT Pub. Date: Apr. 30, 2015

(65) Prior Publication Data
US 2016/0266671 A1    Sep. 15, 2016

(30) Foreign Application Priority Data

Oct. 25, 2013 (JP) .................................. 2013-222584
Feb. 12, 2014 (JP) .................................. 2014-024764

(51) Int. Cl.
*B32B 3/10*     (2006.01)
*G06F 3/041*    (2006.01)
(Continued)

(52) U.S. Cl.
CPC ............ *G06F 3/041* (2013.01); *B32B 17/064* (2013.01); *C03C 15/00* (2013.01); *C03C 17/32* (2013.01);
(Continued)

(58) Field of Classification Search
None
See application file for complete search history.

(56) References Cited

U.S. PATENT DOCUMENTS

| 4,264,970 A | 4/1981 | Nishimura et al. |
| 9,073,291 B2 | 7/2015 | Bookbinder et al. |

(Continued)

FOREIGN PATENT DOCUMENTS

| CN | 101903301 A | 12/2010 |
| CN | 102557467 A | 7/2012 |

(Continued)

OTHER PUBLICATIONS

Taiwanese Office Action (with English translation), Taiwanese Application No. 103137008, dated Apr. 26, 2017 (26 pages).
(Continued)

*Primary Examiner* — Christopher M Polley
(74) *Attorney, Agent, or Firm* — Burr & Brown, PLLC

(57) ABSTRACT

The objective is to provide a cover glass having edge surfaces and a through-hole, formed with high external dimensional precision. The cover glass has a unit substrate comprising glass, and a resinforced portion containing a resin material provided on the edge surfaces of the unit substrate.

10 Claims, 23 Drawing Sheets

(51) Int. Cl.
- *C03C 15/00* (2006.01)
- *C03C 17/32* (2006.01)
- *H05K 5/03* (2006.01)
- *B32B 17/06* (2006.01)
- *G06F 3/044* (2006.01)

(52) U.S. Cl.
CPC ............... *G06F 3/044* (2013.01); *H05K 5/03* (2013.01); *C03C 2217/78* (2013.01); *C03C 2218/36* (2013.01); *G06F 2203/04103* (2013.01); *Y02P 40/57* (2015.11)

(56) References Cited

U.S. PATENT DOCUMENTS

| | | |
|---|---|---|
| 2002/0018163 A1 | 2/2002 | Yamamoto et al. |
| 2011/0003619 A1 | 1/2011 | Fujii |
| 2012/0040146 A1 | 2/2012 | Garner et al. |
| 2012/0135247 A1 | 5/2012 | Lee et al. |
| 2012/0329525 A1* | 12/2012 | Hashimoto ............ C03C 15/00 455/566 |
| 2014/0202985 A1 | 7/2014 | Fujii |
| 2015/0030816 A1 | 1/2015 | Uemura et al. |

FOREIGN PATENT DOCUMENTS

| | | |
|---|---|---|
| JP | 54-062846 A1 | 5/1979 |
| JP | 10-095636 A1 | 4/1998 |
| JP | 11-171595 A1 | 6/1999 |
| JP | 2001-316504 A1 | 11/2001 |
| JP | 2009-167086 A1 | 7/2009 |
| JP | 2012-088946 A1 | 5/2012 |
| JP | 2012-111688 A1 | 6/2012 |
| JP | 2012-148957 A1 | 8/2012 |
| JP | 2012-526040 A1 | 10/2012 |
| JP | 2012-527399 A1 | 11/2012 |
| JP | 2013-071854 A1 | 4/2013 |
| TW | 201231417 A | 8/2012 |
| WO | 2012/094548 A1 | 7/2012 |
| WO | 2013/154034 A1 | 10/2013 |

OTHER PUBLICATIONS

Japanese Office Action (Application No. 2014-032097) dated Oct. 27, 2017 (with English translation).

Japanese Office Action (Application No. 2014-024764) dated Apr. 15, 2014 (with English translation).

Japanese Office Action (Application No. 2014-024764) dated Jul. 8, 2014 (with English translation).

International Search Report and Corrected Written Opinion (Application No. PCT/JP2014/078244) dated Jan. 27, 2015.

Chinese Office Action (with English translation), Chinese Application No. 201480058280.X, dated Dec. 21, 2017 (23 pages).

\* cited by examiner

METHOD OF MANUFACTURING COVER GLASS, COVER GLASS AND COVER GLASS-EQUIPPED DISPLAY DEVICE

BACKGROUND OF THE INVENTION

Technical Field

The present invention relates to a cover glass which is provided on an observer side of a display device, and a method of manufacturing the same. In addition, the present invention relates to the display device provided with the cover glass.

Background Art

Conventionally, a technique has been known in which a cover glass for protection of a display surface of a display device is provided on an observer side of the display device such as a liquid crystal display or an organic EL display. In a case in which the display device is equipped with a touch panel function, the cover glass also serves a role of protecting the display device and a touch panel sensor which is provided on the observer side of the display device. Incidentally, another technique has been also known in which a cover glass and a touch panel sensor are integrally configured.

Recently, portable terminals equipped with display devices have been remarkably popular such as a smart phone and a tablet PC. The portable terminal is required to have durability with respect to a drop impact generated in the use environment. Accordingly, there is a demand for high strength in a cover glass that protects the display device to be capable of withstanding the impact frequently generated. Under such circumstances, Patent Document 1, for example, proposes a method of configuring a cover glass using a tempered glass which includes a compressive stress layer on which a compressive stress is generated being formed on a surface thereof.

In Patent Document 1, the cover glasses having dimensions corresponding to respective dimensions of individual display devices are produced by dividing the large tempered glass into individual pieces. Meanwhile, the compressive stress layer of the tempered glass is formed on the glass surface by chemical treatment, or heat treatment. Accordingly, a tensile stress layer in which a tensile stress is generated is exposed on a side surface of the cover glass to be obtained in a case in which the large tempered glass is divided as in Patent Document 1. Thus, it is considered that it is difficult to manufacture a cover glass having a sufficient strength on a side surface thereof according to the method described in Patent Document 1.

Meanwhile, proposed is a method of providing resin on a side surface of a cover glass to enhance the strength on the side surface of the cover glass. For example, Patent Document 2 proposes a method of framing an outer peripheral surface of a cover glass including a side surface of the cover glass with a plastic membrane. An injection molding method, a dispensing method, a spray coating method, a roller coating method or the like is proposed as the framing method.

Patent Document 1: Japanese Patent Application Laid-Open No. 2012-88946

Patent Document 2: Japanese Patent Application Laid-Open No. 2012-111688

SUMMARY OF THE INVENTION

When the display device is seen from an observer side, the display device is partitioned into an active area in which a video is displayed, and a non-active area (so-called frame region) in a periphery thereof. Recently, not only a black color, which is conventionally employed in general, but also a white color and other various colors have been employed as colors of the frame region in order to enhance design effect of the display device. In general, such colors are implemented using a decorative portion which is provided on a surface, on a display device side, of the cover glass. It is important to sufficiently enhance external dimensional accuracy of the cover glass, that is, accuracy in processing the side surface of the cover glass in order to sufficiently enhance accuracy in processing the decorative portion with respect to the display device. In addition, there is a demand for the high external dimensional accuracy in the portable terminal equipped with the display device also at the time of assembling the cover glass, the display device and a case from a viewpoint of waterproofness or design effect. Accordingly, the external dimensional accuracy of the cover glass is also important on consideration of enhancing ease and a yield of the process.

Meanwhile, it is difficult to precisely control a coating dimension of the plastic membrane framing the outer peripheral surface of the cover glass in the method that is proposed in Patent Document 2. Thus, it is difficult to realize the high external dimensional accuracy of the cover glass, and as a result, it is considered that the design effect of the display device is damaged or the yield of the assembly process with the display device is reduced.

In addition, it is considered that processing of a cover glass in which a glass edge is exposed, such as adjusting an external dimension using physical polishing or curved surface processing of the outer peripheral portion for improvement of the design effect, is difficult because such additional processing of the outer peripheral portion of the cover glass introduces a remarkable decrease of the strength of the cover glass.

The present invention has been made in view of the above-described points, and an object thereof is to provide a cover glass, which is provided with a reinforcing portion formed at high external dimensional accuracy, and a cover glass-equipped display device.

The present invention relates to a method of manufacturing a cover glass to be provided in a display device, the method of manufacturing the cover glass including: a step of preparing a unit laminated body that includes a unit base member, which includes a first surface, a second surface on an opposite side of the first surface, and a side surface spreading between the first surface and the second surface and comprises a glass or the like, and a first protective film provided on the first surface of the unit base member, and a second protective film provided on the second surface; a coating step of applying a coating liquid containing a resin material on the side surface of the unit base member; and a curing step of curing the coating liquid on the side surface of the unit base member to form a reinforcing portion on the side surface of the unit base member, in which the first protective film is configured to laterally protrude than the first surface of the unit base member, and further, the second protective film is configured to laterally protrude than the second surface of the unit base member, and, in the coating step, the coating liquid is applied into a space surrounded by the side surface of the unit base member, the first protective film, and the second protective film.

In the method of manufacturing the cover glass according to the present invention, a position of an edge on a first surface of the reinforcing portion, which is formed in the curing step, may match a position of an end surface of the first protective film, and a position of an edge on a second surface of the reinforcing portion, which is formed in the curing step, may match a position of an end surface of the second protective film. Alternatively, an edge on a first surface of the reinforcing portion, which is formed in the curing step, may be positioned at an inner side than an end surface of the first protective film, and an edge on a second surface of the reinforcing portion, which is formed in the curing step, may be positioned at an inner side than an end surface of the second protective film.

In the method of manufacturing the cover glass according to the present invention, the unit base member may include a compressive stress layer, which is formed at least at the first surface and the second surface, and a tensile stress layer which is positioned between the compressive stress layer at the first surface side and the compressive stress layer at the second surface side. In this case, the tensile stress layer may be exposed to the side surface of the unit base member. Even when the tensile stress layer is exposed to the side surface of the unit base member, the reinforcing portion is formed such that the tensile stress layer exposed to the side surface of the unit base member is covered by the reinforcing portion, and thus, it is possible to sufficiently enhance an impact resistance of the cover glass.

In the method of manufacturing the cover glass according to the present invention, the unit base member may be obtained by performing a cutting step of cutting a base member comprising a tempered glass.

The method of manufacturing the cover glass according to the present invention may further include a protective film forming step of providing the first protective film and the second protective film in a plurality of predetermined sections on the first surface and the second surface of the base member, the protective film forming step performed prior to the cutting step. In this case, in the cutting step, the unit laminated body is obtained by cutting the base member along each clearance of the first protective film and the second protective film provided in each of the sections.

In the method of manufacturing the cover glass according to the present invention, the cutting step may include a step of cutting the base member by wet etching the base member from the first surface side and the second surface side of the base member using the first protective film and the second protective film as a resist.

The method of manufacturing the cover glass according to the present invention may further include an element portion forming step of forming at least a part of element portions including at least any one of a decorative portion and a touch panel sensor unit in the first surface side of the base member.

In the method of manufacturing the cover glass according to the present invention, the element portion forming step may be performed prior to the protective film forming step.

The present invention relates to a cover glass to be provided in a display device, the cover glass including: a unit base member which includes a first surface, a second surface positioned on an opposite side of the first surface, and a side surface spreading between the first surface and the second surface, and comprises a glass or the like; and a reinforcing portion which is provided on the side surface of the unit base member, and contains a resin material.

In the cover glass according to the present invention, the reinforcing portion may include a first surface laterally extending from an edge of the first surface of the unit base member, a second surface laterally extending from an edge of the second surface of the unit base member, and a side surface spreading between the first surface and the second surface of the reinforcing portion. In this case, preferably, a difference in level between the first surface of the unit base member and the first surface of the reinforcing portion is equal to or smaller than 10 μm, and a difference in level between the second surface of the unit base member and the second surface of the reinforcing portion is equal to or smaller than 10 μm.

In the cover glass according to the present invention, the unit base member may include a compressive stress layer, which is formed at least at the first surface and the second surface, and a tensile stress layer which is positioned between the compressive stress layer at the first surface side and the compressive stress layer at the second surface side. In this case, the tensile stress layer may be exposed to the side surface of the unit base member.

In the cover glass according to the present invention, a minimum value of a coating dimension of the reinforcing portion, which is provided on the side surface of the unit base member, is set to be equal to or larger than 20 μm.

In the cover glass according to the present invention, the side surface of the reinforcing portion may protrude than a virtual plane passing an edge of the first surface and an edge of the second surface of the reinforcing portion. In this case, a protruding amount of the side surface is preferably set to be equal to or smaller than 500 μm.

In the cover glass according to the present invention, the side surface of the reinforcing portion may be recessed than a virtual plane passing an edge of the first surface and an edge of the second surface of the reinforcing portion. In this case, a recessed amount of the side surface is preferably set to be equal to or smaller than 200 μm.

In the cover glass according to the present invention, the side surface of the unit base member may include a first side surface, which intersects the first surface of the unit base member and spreads outward as approaching the second surface side of the unit base member, and a second side surface which intersects the second surface of the unit base member, spreads outward as approaching the first surface side of the unit base member, and further, is merged into the first side surface.

In the cover glass according to the present invention, a decorative portion to exhibit a predetermined color may be provided in the first surface side of the unit base member. In this case, the reinforcing portion may be configured to exhibit the same color as the decorative portion.

In the cover glass according to the present invention, the decorative portion may be configured to overlap the reinforcing portion when seen along a normal direction of the cover glass.

In the cover glass according to the present invention, the reinforcing portion may be configured to exhibit a predetermined color.

In the cover glass according to the present invention, at least a part of a touch panel sensor unit may be provided on the first surface side of the unit base member.

In the cover glass according to the present invention, the unit base member may have a rectangular shape with four corners when seen in a plan view, and the reinforcing portion may be provided in a part including the four corners of the unit base member in the side surface of the unit base member.

In the cover glass according to the present invention, the reinforcing portion may be provided on the side surface of the unit base member such that the unit base member is surrounded by the reinforcing portion when seen in a plan view.

In the cover glass according to the present invention, a through-hole may be formed in the unit base member, and the reinforcing portion may be provided on a wall surface of the through-hole.

In the cover glass according to the present invention, a conductive particle may be added in the reinforcing portion.

In the cover glass according to the present invention, the resin material of the reinforcing portion may contain a polyene-polythiol-based photocurable resin.

In the cover glass according to the present invention, at least one of a part, of the side surface of the reinforcing portion, intersecting with the first surface of the reinforcing portion and a part thereof intersecting with the second surface of the reinforcing portion may have a round surface or an angular surface.

Another cover glass according to the present invention is a cover glass including: a unit base member which includes a first surface, a second surface on an opposite side of the first surface, and a side surface spreading between the first surface and the second surface, and comprises a glass; and a reinforcing portion which is provided on the side surface of the unit base member, and contains a resin material, in which the resin material of the reinforcing portion contains a polyene-polythiol-based photocurable resin.

The present invention relates to a cover glass-equipped display device which is provided with a display device and a cover glass disposed in the display device, and in which the cover glass is formed using the above-described cover glass.

According to the present invention, it is possible to provide the cover glass which is provided with the side surface formed at the high external dimensional accuracy.

DETAILED DESCRIPTION OF THE INVENTION

Figure 1:
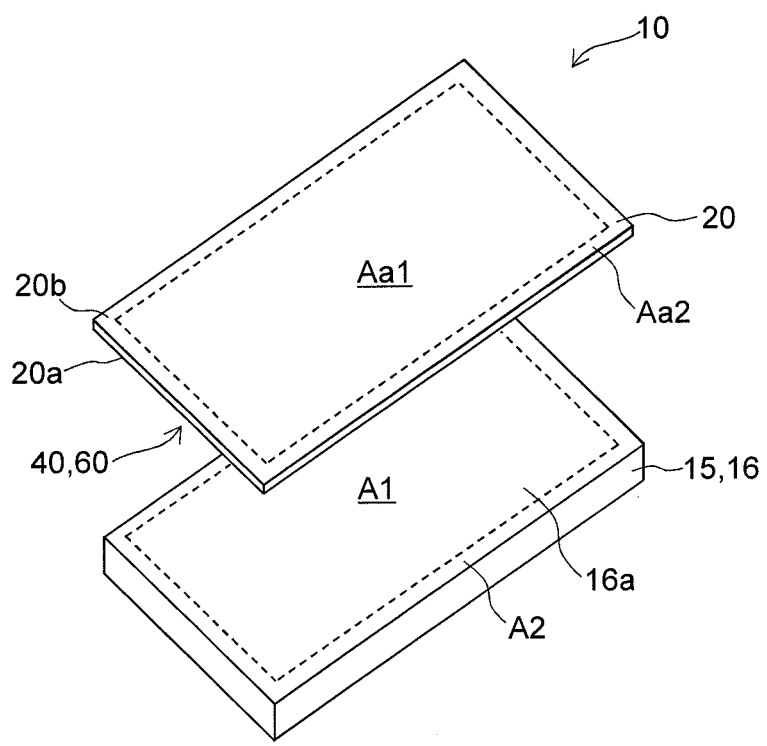
FIG. 1 is a developed view illustrating a cover glass-equipped display device according to an embodiment of the present invention.

Hereinafter, embodiments of the present invention will be described with reference to FIGS. 1 to 7D. Incidentally, in the drawings appended to the present specification, scales and horizontal and vertical dimension ratios are appropriately changed and exaggerated as compared to actual ones thereof in order for convenience of illustration and facilitating the understanding.

(Cover Glass-Equipped Display Device)

First, a cover glass-equipped display device 10 will be described with reference to FIG. 1. As illustrated in FIG. 1, the cover glass-equipped display device 10 is configured by combining a display device 15 and a cover glass 20. The display device 15 illustrated in FIG. 1 is configured as a flat panel display. The display device 15 includes a display panel 16 having a display surface 16a, and a display control unit (not illustrated) which is connected to the display panel 16. The display panel 16 includes an active area A1, which is capable of displaying a video, and a non-active area (referred to also as a frame region) A2 which is disposed on an outer side of the active area A1 to enclose the active area A1. The display control unit processes information relating to the video that needs to be displayed and drives the display panel 16 on the basis of the video information. The display panel 16 displays the predetermined video on the display surface 16a based on a control signal of the display control unit. That is, the display device 15 serves a role as an output device that outputs information such as a letter or a figure as the video.

As illustrated in FIG. 1, the cover glass 20 is disposed on the display surface 16a of the display panel 16 on an observer side of the display device 15. For example, this cover glass 20 is attached onto the display surface 16a of the display device 15 via an adhesion layer (not illustrated). In FIG. 1, a surface of the cover glass 20 at the display device side (first surface) is represented by reference sign 20a, and a surface thereof at the observer side (second surface) is represented by reference sign 20b.

Incidentally, the cover glass 20 is configured to serve a touch panel function as well as a role to protect the display device 15 in the present embodiment. To be specific, a touch panel sensor unit 40, which includes a sensor electrode to detect approach or contact of an external conductor, is provided on the first surface 20a of the cover glass 20 at the display device 15 side. In addition, a decorative portion 60, which is configured to exhibit a desired color, is further, provided in the non-active area Aa2 of the first surface 20a of the cover glass 20.

(Touch Panel Sensor)

Figure 2:
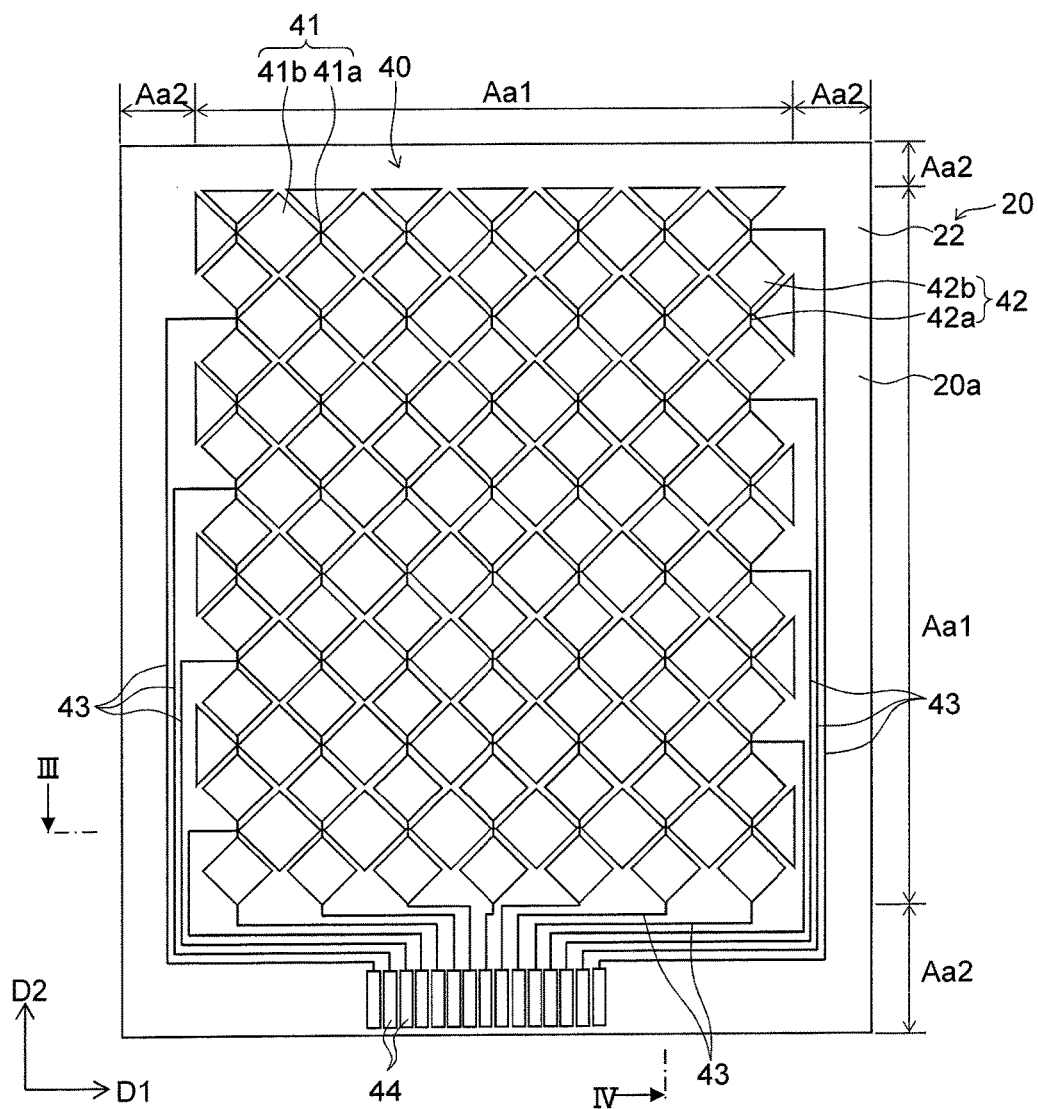
FIG. 2 is a plan view illustrating a touch panel sensor unit which is provided in a cover glass of FIG. 1.

Next, a description will be given regarding the touch panel sensor unit 40, which is provided on the first surface 20a of the cover glass 20, with reference to FIG. 2. FIG. 2 is a plan view illustrating a case in which the cover glass 20 is seen from the first surface 20a side. Incidentally, the decorative portion 60 is not illustrated in FIG. 2 for convenience of description.

The touch panel sensor unit 40 illustrated in FIG. 2 is configured as an electrostatic capacitive coupling system of a projection type, and is configured to be capable of detecting a contact position (referred to also as a touch position) of an external conductor (for example, a human finger) at the touch panel sensor unit 40. Incidentally, it is possible to detect any approach region of the external conductor in the touch panel device when the external conductor just approaches the touch panel sensor unit 40 in a case in which the touch panel sensor unit 40 of the electrostatic capacitive coupling system has an excellent detection sensitivity. Accordingly, the "contact position" used here is a concept including an approach position that may be detected although the position is not actually in contact. Incidentally, the "capacitive coupling" system is also called an "electrostatic capacitive" system or an "electrostatic capacitive coupling" system in the technical field of the touch panel, and is handled as a term having the same meaning as the "electrostatic capacitive" system or the "electrostatic capacitive coupling" system in the present application.

As illustrated in FIG. 2, the first surface 20a of the cover glass 20 is partitioned into an active area Aa1, which corresponds to the region in which the touch position can be detected, and a non-active area Aa2, which is positioned in the periphery of the active area Aa1, in response to the active area A1 and the non-active area A2 of the display panel 16. In addition, the touch panel sensor unit 40 is provided with a plurality of sensor electrodes 41 and 42 disposed in the active area Aa1, a plurality of take-out wirings 43, which are disposed in the non-active area Aa2 of the cover glass 20 and connected to the corresponding sensor electrodes 41 and 42, and a plurality of terminal portions 44 which are connected to the corresponding take-out wirings 43.

As illustrated in FIG. 2, the sensor electrodes 41 and 42 include a plurality of first sensor electrodes 41 extending along a first direction D1, and a plurality of second sensor electrodes 42 extending along a second direction D2 which is orthogonal to the first direction D1. The first sensor electrode 41 may include a first line portion 41a linearly extending along the first direction D1, and a first bulging portion 41b bulging from the first line portion 41a. The first bulging portion 41b indicates a portion which bulges out from the first line portion 41a along the surface of the cover glass 20. In the same manner, the second sensor electrode 42 may include a second line portion 42a extending along the second direction D2, and a second bulging portion 42b bulging from the second line portion 42a.

The take-out wiring 43 is provided in the non-active area Aa2 to transfer a signal detected by the corresponding sensor electrodes 41 and 42 to the terminal portion 44. The signal, which has been transferred to the terminal portion 44 by the take-out wiring 43, is transfer to a detection control unit via a flexible substrate (not illustrated) mounted to the terminal portion 44.

(Layer Configuration of Cover Glass, Touch Panel Sensor Unit, and Decorative Portion)

Figure 3:
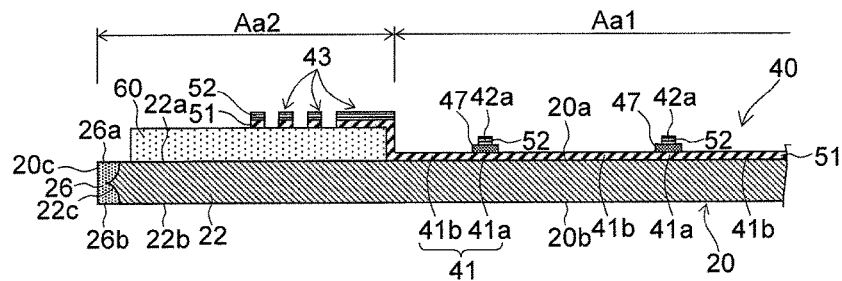
FIG. 3 is a cross-sectional view taken along a line III of the cover glass of FIG. 2.
Figure 4:
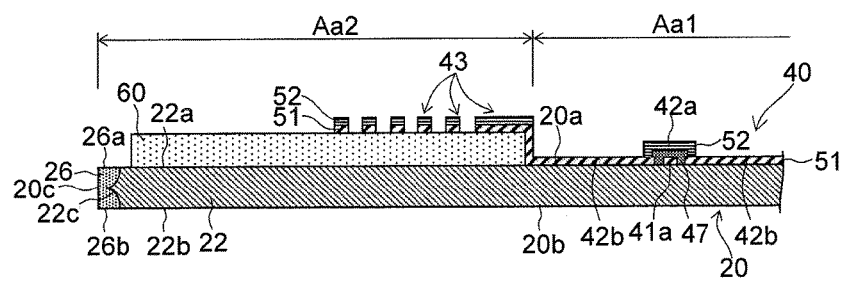
FIG. 4 is a cross-sectional view taken along a line IV of the cover glass of FIG. 2.

Next, a description will be given regarding a layer configuration of the cover glass 20, and the touch panel sensor unit 40 and the decorative portion 60 which are provided in the first surface 20a of the cover glass 20 with reference to FIGS. 3 and 4. FIGS. 3 and 4 are cross-sectional views which are taken along a line III and a line IV, respectively, of the cover glass 20 illustrated in FIG. 2.

First, a description will be given regarding a layer configuration of constituting elements which are disposed in the active area Aa1 of the cover glass 20. As illustrated in FIGS. 3 and 4, the first line portion 41a, the first bulging portion 41b, and the second bulging portion 42b of the touch panel sensor unit 40 may be formed on the same plane. In this case, it is possible to form the first line portion 41a, the first bulging portion 41b, and the second bulging portion 42b at the same time by patterning a transparent conductive layer 51 which is formed using a transparent conductive material such as indium tin oxide (ITO).

As illustrated in FIGS. 3 and 4, the first line portion 41a and the second line portion 42a are formed to partially overlap each other when seen in the normal direction of the cover glass 20. In this case, it is possible to prevent conduction between the first line portion 41a and the second line portion 42a by providing an insulating layer 47 to be interposed between the first line portion 41a and the second line portion 42a. Incidentally, the insulating layer 47 may be provided on the first bulging portion 41b or on the second bulging portion 42b, although not illustrated, in addition to the portion between the first line portion 41a and the second line portion 42a.

A material to form the second line portion 42a is not particularly limited as long as the second line portion 42a has conductivity. For example, the second line portion 42a may be formed using the transparent conductive material such as the indium tin oxide (ITO) in the same manner as the first line portion 41a, the first bulging portion 41b, and the second bulging portion 42b, or may be formed using a non-transparent conductive material such as a silver alloy or copper. In the present embodiment, a description will be given regarding an example in which the second line portion 42a is formed using a metal layer 52 which is also included in the take-out wiring 43 and the terminal portion 44.

Next, a description will be given regarding a layer configuration of constituting elements which are disposed in the non-active area Aa2 of the cover glass 20. As illustrated in FIGS. 3 and 4, the decorative portion 60 is disposed in the non-active area Aa2 to be positioned at the observer side than the above-described take-out wiring 43. In this case, the decorative portion 60 is visually recognized from the observer side through the cover glass 20. That is, the appearance of the non-active area Aa2 is determined by the decorative portion 60 and constituting elements in the periphery thereof in the cover glass-equipped display device 10.

The color of the decorative portion 60 is selected according to the design effect to be acquired for the cover glass-equipped display device 10. For example, examples of the color of the decorative portion 60 can include black, white, light blue, peach, green and the like. A material to form the decorative portion 60 is determined according to the selected color, and the decorative portion 60 is formed using a resin material in which coloring pigments such as titanium oxide are dispersed, for example, in the case of acquiring the white.

Next, a configuration of the cover glass 20 will be described. As illustrated in FIGS. 3 and 4, the cover glass 20 is provided with a unit base member 22 and a reinforcing portion 26. The unit base member 22 includes a first surface 22a at the display device side, a second surface 22b at the opposite side of the first surface 22a, and a side surface 22c spreading between the first surface 22a and the second surface 22b. Further, the reinforcing portion 26 is provided on the side surface 22c of the unit base member 22.

Figure 5:
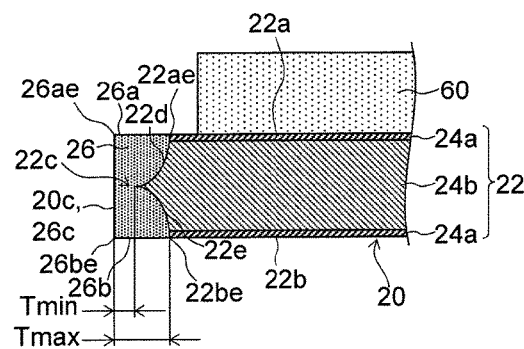
FIG. 5 is a cross-sectional view illustrating a side surface of the cover glass of FIG. 3 in an enlarged manner.

As described below, the unit base member 22 is obtained by dividing a base member 30 formed using a large tempered glass into individual pieces. As illustrated in FIG. 5, this unit base member 22 includes a compressive stress layer 24a, which is formed at the first surface 22a and the second surface 22b, and a tensile stress layer 24b which is positioned between the compressive stress layer 24a at the first surface 22a side and the compressive stress layer 24a at the second surface 22b side. The compressive stress layer 24a Indicates a layer in which a compressive stress is generated, and the tensile stress layer 24b indicates a layer in which a tensile stress is generated. Examples of a method of forming the compressive stress layer 24a and the tensile stress layer 24b include a physical strengthening (air-cooling and tempering) and a chemical strengthening. For example, chemical treatment is performed in the chemical strengthening in a manner such that alkali ions included in the glass is exchanged with other alkali ions with a larger ionic radius at the temperature equal to or lower than the strain point. Accordingly, it is possible to generate the compressive stress in the vicinity of a surface layer in which the ions are exchanged. When the compressive stress layer 24a is formed, it is possible to prevent spreading of scratch even in a case in which a certain impact is applied to the first surface 22a or the second surface 22b, and accordingly, the scratch such as a crack is formed on the first surface 22a or the second surface 22b. Thus, the first surface 22a and the second surface 22b of the unit base member 22 have high resistance with respect to the impact. It is possible to use aluminosilicate glass, for example, as a material to form the unit base member 22. A thickness of the compressive stress layer 24a is generally set within a range of 10 to 100 μm.

Meanwhile, the tensile stress layer 24b of the unit base member 22 reaches the side surface 22c of the unit base member 22 as illustrated in FIG. 5. That is, the tensile stress layer 24b is exposed on the side surface 22c of the unit base member 22. Thus, the side surface 22c of the unit base member 22 is vulnerable to the damage such as the crack as compared to the first surface 22a and the second surface 22b of the unit base member 22. The above-described reinforcing portion 26 is provided to protect the side surface 22c of the unit base member 22 formed in such a manner.

A curable resin, which is cured by heating, ultraviolet irradiation or the like, for example, is used as a material to form the reinforcing portion 26. In this case, the reinforcing portion 26 has a desired liquidity when being molded before curing, and further, the reinforcing portion 26 has desired hardness and strength after being cured. Accordingly, it is possible to acquire both the moldability and the hardness and strength.

In a case in which the reinforcing portion 26 includes the curable resin cured by ultraviolet irradiation, it is possible to use a combination of an acrylic resin and a photopolymerization initiator, for example, as the material to form the reinforcing portion 26.

In a case in which the reinforcing portion 26 includes the curable resin cured by heating, it is possible to use an epoxy resin, for example, as the material to form the reinforcing portion 26.

Next, a description will be given more in detail regarding shapes of the side surface 22c of the unit base member 22 and the reinforcing portion 26 with reference to FIG. 5. FIG. 5 is a cross-sectional view illustrating the side surface 20c of the cover glass 20 of FIG. 3 in an enlarged manner.

First, the shape of the reinforcing portion 26 will be described. As illustrated in FIG. 5, the reinforcing portion 26 includes a first surface 26a which laterally extends from the vicinity of an edge 22ae of the first surface 22a on the same plane with the first surface 22a of the unit base member 22, a second surface 26b which laterally extends from the vicinity of an edge 22be of the second surface 22b on the same plane as the second surface 22b of the unit base member 22, and a side surface 26c spreading between the first surface 26a and the second surface 26b of the reinforcing portion 26. Hereinafter, a description will be given regarding advantages that are brought about by the reinforcing portion 26 including the first surface 26a and the second surface 26b as above.

First, a description will be given regarding a problem which considered in Patent Document 2 described above for comparison. When a reinforcing portion to reinforce a side surface of a base member is provided by framing an outer peripheral surface of the base member as in Patent Document 2, a difference in level is formed between a plane of the reinforcing portion and a plane of the base member. Accordingly, scattering of light or a great change in transmittance and reflectance of light is easily caused in a boundary between the reinforcing portion and the base member. As a result, the boundary between the reinforcing portion and the base member is likely to be visually recognized by the observer. That is, it is considered that the design effect of the cover glass is reduced. In addition, a feeling of operating a touch panel is inhibited due to the difference in level in a case in which the reinforcing portion of the cover glass is exposed to the outside.

On the contrary, the first surface 22a of the unit base member 22 and the first surface 26a of the reinforcing portion 26 are positioned on the same plane according to the present embodiment. In the same manner, the second surface 22b of the unit base member 22 and the second surface 26b of the reinforcing portion 26 are positioned on the same plane. That is, a difference in level is completely or almost not present between the unit base member 22 and the reinforcing portion 26. To be specific, a difference in level between each of the first surface 22a and the second surface 22b of the unit base member 22, and each of the first surface 26a and the second surface 26b of the reinforcing portion 26 is equal to or smaller than 10 µm. Thus, it is possible to suppress a boundary between the unit base member 22 and the reinforcing portion 26 from being visually recognized by the observer. Accordingly, it is possible to secure both the strength of the side surface 20c of the cover glass 20 and the design effect of the cover glass 20 according to the reinforcing portion 26 of the present embodiment. In addition, the feeling of operating the touch panel is not inhibited by the difference in level. In addition, the thickness of the compressive stress layer 24a is generally set within the range of 10 to 100 µm as described above. Accordingly, the compressive stress layer 24a of the unit base member 22 and the reinforcing portion 26 at least partially overlap each other in the side surface 22c of the unit base member 22 in a case in which the difference in level between each of the first surface 22a and the second surface 22b of the unit base member 22 and each of the first surface 26a and the second surface 26b of the reinforcing portion 26 is equal to or smaller than 10 µm, that is, a case in which the difference in level is smaller than the thickness of the compressive stress layer 24a. Accordingly, it is possible to cover the tensile stress layer 24b exposed to the side surface 22c of the unit base member 22 with the reinforcing portion 26 without any clearance. Thus, it is possible to more reliably enhance the impact resistance of the cover glass 20.

Preferably, each of the first surface 26a and the second surface 26b of the reinforcing portion 26 is laterally extended from the edge 22ae and the edge 22be by at least 300 µm on the same plane with the first surface 22a and the second surface 22b of the unit base member 22. Accordingly, it is possible to more reliably secure the strength of the side surface 20c of the cover glass 20 and the design effect of the cover glass 20. Incidentally, the expression of "on the same plane" means that an interval, in the thickness direction of the unit base member 22, between each part of the first surface 26a and the second surface 26b of the reinforcing portion 26 laterally extending from the edge 22ae and the edge 22be by at least 300 µm, and each of the first surface 22a and the second surface 22b of the unit base member 22 is equal to or smaller than 10 µm, similarly as in the case of the above-described difference in level.

Next, the side surface 26c of the reinforcing portion 26 will be described. In FIG. 5, an edge of the first surface 26a of the reinforcing portion 26 is represented by reference sign 26ae, and an edge of the second surface 26b of the reinforcing portion 26 is represented by reference sign 26be. As illustrated in FIG. 5, the side surface 26c is configured as a flat surface which substantially evenly spreads between the edge 26ae and the edge 26be. Further, the first surface 26a and the side surface 26c intersect each other at a substantially right angle, and similarly, the second surface 26b and the side surface 26c intersect each other at a substantially right angle. That is, a position of the edge 26ae and a position of the edge 26be match each other in the horizontal direction of FIG. 5 (extending direction of the first surface 26a and the second surface 26b).

Next, the shape of the side surface 22c of the unit base member 22 will be described. As illustrated in FIG. 5, the side surface 22c of the unit base member 22 includes a first side surface 22d and a second side surface 22e. The first side surface 22d intersects the edge 22ae of the first surface 22a of the unit base member 22, and spreads outward as approaching the second surface 22b side of the unit base member 22. In addition, the second side surface 22e intersects the edge 22be of the second surface 22b of the unit base member 22, spreads outward as approaching the first surface 22a side of the unit base member 22, and further, is merged into the first side surface 22d. Thus, a merging portion of the first side surface 22d and the second side surface 22e protrudes to the outer side. In this case, the reinforcing portion 26 has a shape of sandwiching the side surface 22c of the unit base member 22, and thus, it is possible to firmly bring the reinforcing portion 26 into close contact with the side surface 22c of the unit base member 22.

The first side surface 22d and the second side surface 22e having the above-described shapes are formed by, for example, wet etching the base member 30 from both the first surface side and the second surface side of the base member 30 at the time of dividing the base member 30 and obtaining the unit base member 22 as described below.

(Dimension of Cover Glass)

Next, a dimension of the cover glass 20 will be described. First, a description will be given regarding a coating dimension of the reinforcing portion 26 provided on the side surface 22c of the unit base member 22. Here, the coating dimension indicates a length of the reinforcing portion 26 in a direction along the normal direction of the side surface 26c of the reinforcing portion 26. The normal direction of the side surface 26c of the reinforcing portion 26 is parallel to the horizontal direction of FIG. 5.

In FIG. 5, a minimum value of the coating dimension of the reinforcing portion 26 is represented by reference sign Tmin. Incidentally, the first side surface 22d of the unit base member 22 spreads outward as approaching the second surface 22b side in the present embodiment as described above. In addition, the second side surface 22e of the unit base member 22 spreads outward as approaching the first surface 22a side. In addition, the side surface 26c of the reinforcing portion 26 is formed as the flat surface which intersects the first surface 26a and the second surface 26b at the right angle as described above. Thus, the coating dimension of the reinforcing portion 26 has the minimum value Tmin at the position at which the first side surface 22d and the second side surface 22e are merged as illustrated in FIG. 5.

The minimum value Tmin of the coating dimension of the reinforcing portion 26 is suitably set so as to be capable of protecting the side surface 22c of the unit base member 22 even in a case in which the impact is applied to the side surface 20c of the cover glass 20 and the like. For example, the minimum value Tmin of the coating dimension of the reinforcing portion 26 is set to be equal to or larger than 20 µm.

In addition, the coating dimension of the reinforcing portion 26 has a maximum value at the position of the first surface 26a or the position of the second surface 26b in the present embodiment. Meanwhile, when the maximum value of the coating dimension of the reinforcing portion 26 is too large, it is considered that the reinforcing portion 26 is easily peeled off from the unit base member 22 when the impact is applied to the cover glass 20. In addition, a proportion of the glass is decreased, and a proportion of the resin is increased in the cover glass 20, and thus, it is also considered that the strength of the cover glass 20 decreases. On consideration of this point, it is preferable that the maximum value of the coating dimension of the reinforcing portion 26 is set to be equal to or smaller than 250 µm in a part at which the coating is the thinnest (the part represented by reference sign Tmin in FIG. 5), and is set to be equal to or smaller than 500 µm in a part at which the coating is the thickest (the part represented by reference sign Tmax in FIG. 5).

For example, it is considered that the coating dimension Tmin of the reinforcing portion 26 in the part at which the coating is the thinnest is set to 100 µm, and the coating dimension Tmax of the reinforcing portion 26 in the part at which the coating is the thickest is set to 300 µm in the example illustrated in FIG. 5.

A thickness of the cover glass 20 (that is, a thickness of the unit base member 22 and a thickness of the reinforcing portion 26) is suitably set depending on the strength to be acquired, the area of the cover glass 20, or the like, and, for example, is set within a range of 0.1 mm to 1 mm.

(Method of Manufacturing Cover Glass)

Next, a description will be given regarding a method of manufacturing the cover glass 20 which has the above-described configuration with reference to FIGS. 6A to 7D.

First, a description will be given regarding a step of forming a unit laminated body 35 which includes the unit base member 22 and protective films 81 and 82 using the base member 30 made of the large tempered glass with reference to FIGS. 6A to 6E(b). Incidentally, FIGS. 6A, 6B(a), 6C, 6D(a) and 6E(a) are cross-sectional views illustrating the base member 30 in this step. In addition, FIG. 6E(b) is a cross-sectional view illustrating the unit laminated body 35 illustrated in FIG. 6E(a) in an enlarged manner. In addition, FIGS. 6B(b) and 6D(b) are plan views illustrating the base member 30 in this step.

Figure 6A:
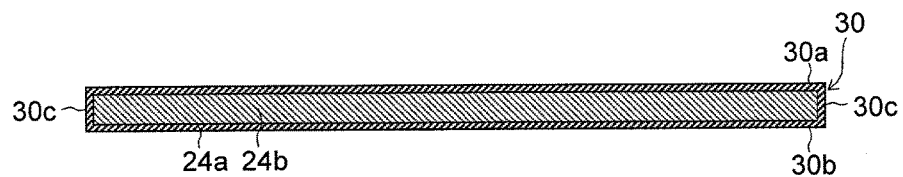
FIG. 6A is a diagram illustrating a part of a step of forming a unit laminated body, which includes a unit base member and a protective film, using a base member formed using a large tempered glass.

First, the base member 30 made of the large tempered glass is prepared as illustrated in FIG. 6A. The base member 30 includes a first surface 30a, a second surface 30b on the opposite side of the first surface 30a, and a side surface 30c spreading between the first surface 30a and the second surface 30b. As illustrated in FIG. 6A, the compressive stress layer 24a is formed at the first surface 30a, the second surface 30b, and the side surface 30c of the base member 30, and further, the tensile stress layer 24b is present at the inner side of the compressive stress layer 24a. In this manner, the entire surface of the base member 30 is formed using the compressive stress layer 24a.

Figure 6B:
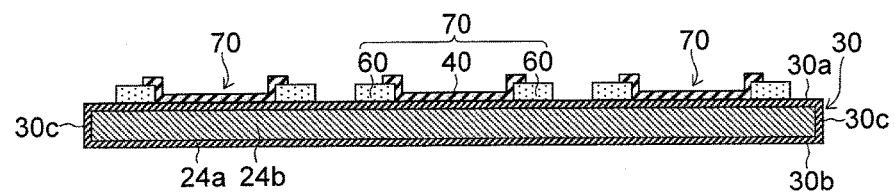
FIGS. 6B(a) and 6B(b) are diagrams illustrating each part of the step of forming a unit laminated body, which includes the unit base member and the protective film, using the base member formed using the large tempered glass.
Figure 6B:
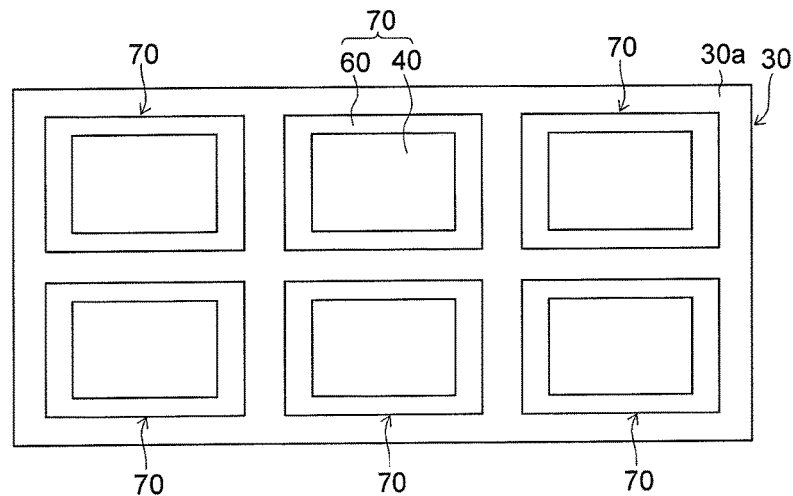

Next, the decorative portion 60 and the touch panel sensor unit 40 are formed in a plurality of predetermined sections on the first surface 30a of the base member 30 as illustrated in FIGS. 6B(a) and 6B(b) (an element portion forming step). For example, in FIG. 6B(b), the decorative portion 60 and the touch panel sensor unit 40 are formed in each of six sections which are obtained by partitioning the first surface 30a of the base member 30 into two rows in the vertical direction of the paper plane, and three columns in the horizontal direction of the paper plane. Incidentally, the number of the sections of the base member 30 is not particularly limited. A known method is appropriately used as a method of forming the decorative portion 60 and the touch panel sensor unit 40 on the first surface 30a side, and, for example, a photolithographic method is used. Incidentally, the touch panel sensor unit 40 and the decorative portion 60 are collectively referred to as an element portion 70 in some cases in the following description.

Figure 6C:
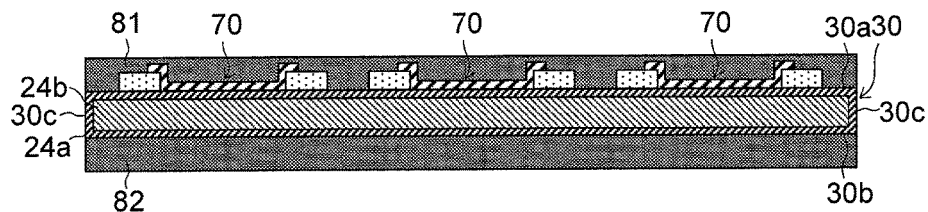
FIG. 6C is a diagram illustrating a part of the step of forming a unit laminated body, which includes the unit base member and the protective film, using the base member formed using the large tempered glass.

Thereafter, a protective film forming step is performed in which the first protective film 81 and the second protective film 82 are provided in the plurality of predetermined sections on the first surface 30a and the second surface 30b of the base member 30. First, the first protective film 81 to continuously cover the element portion 70 provided in each of the plurality of sections is provided on the first surface 30a of the base member 30 as illustrated in FIG. 6C. In addition, the second protective film 82 is provided on the second surface 30b of the base member 30. In the example illustrated in FIG. 6C, each of the first protective film 81 and the second protective film 82 is provided to cover the entire region of the first surface 30a and the second surface 30b of the base member 30.

The protective films 81 and 82 function as a resist to protect the element portion 70 at the time of dividing the base member 30 by wet etching, which will be described later, using hydrofluoric acid or the like. A material to form the protective films 81 and 82 is not particularly limited as long as the material has a resistance with respect to the etchant to be used for division of the base member 30. For example, it is possible to use a biaxially-oriented polypropylene or an unstretched polypropylene having a thickness of approximately 50 to 100 μm as the material to form the protective films 81 and 82. In this case, the protective films 81 and 82 are configured by pasting a sheet of the biaxially-oriented polypropylene or the unstretched polypropylene onto the first surface 30a and the second surface 30b of the base member 30 via an adhesive layer having a thickness of approximately 20 μm.

Figure 6D:
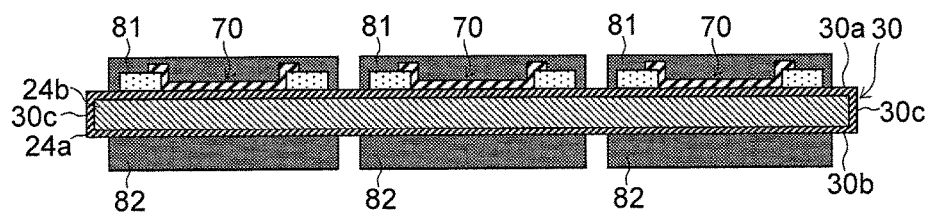
FIGS. 6D(a) and 6D(b) are diagrams illustrating each part of the step of forming a unit laminated body, which includes the unit base member and the protective film, using the base member formed using the large tempered glass.
Figure 6D:
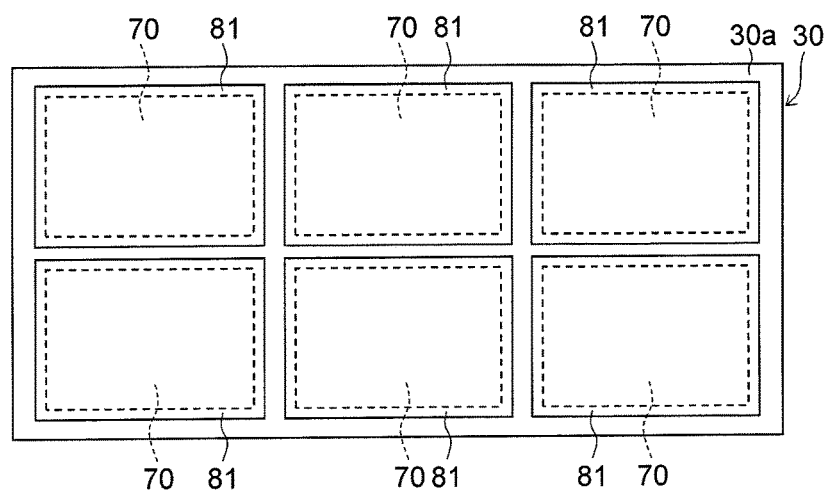

Thereafter, as illustrated in FIGS. 6D(a) and 6D(b), the first protective film 81 and the second protective film 82, provided over the entire region of the first surface 30a and the second surface 30b, are divided into each section of the first surface 30a and the second surface 30b. Accordingly, a clearance is formed along each boundary of the sections in the first protective film 81 covering each of the element portions 70 and the second protective film 82 corresponding thereto.

Various methods can be employed without particularly limiting a specific method of dividing the first protective film 81 and the second protective film 82. For example, a mold having a shape corresponding to a shape of the first protective film 81, illustrated in FIG. 6D(b), may be used to remove an unnecessary part (part which becomes the clearance) of the first protective film 81. It is possible to remove an unnecessary part (part which becomes the clearance) of the second protective film 82 on the second surface 30b side also using a mold having a shape corresponding to the mold for the first protective film 81. Besides, laser processing may be used to remove the unnecessary parts of the first protective film 81 and the second protective film 82.

Figure 6E:
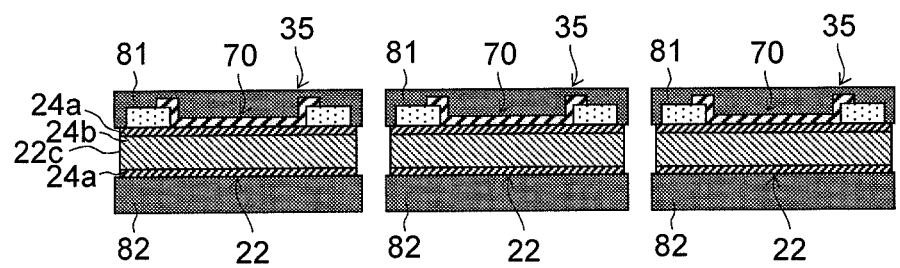
FIGS. 6E(a) and 6E(b) are diagrams illustrating each part of the step of forming a unit laminated body, which includes the unit base member and the protective film, using the base member formed using the large tempered glass.
Figure 6E:
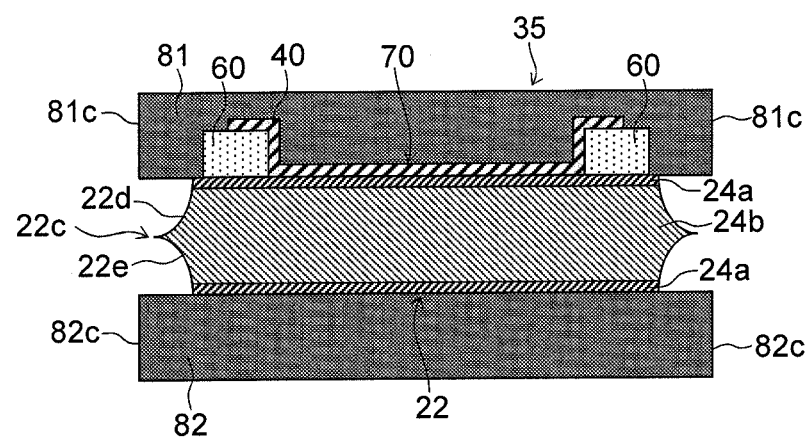

Thereafter, a cutting step is performed as illustrated in FIG. 6E(a) in which the base member 30 is cut along each clearance of the first protective film 81 and the second protective film 82 provided in each section of the base member 30. To be specific, the base member 30 is cut by wet etching the base member 30 from the first surface 30a side and the second surface 30b side of the base member 30 using the first protective film 81 and the second protective film 82 as the resist. The hydrofluoric acid or the like is used as the etchant as described above. Accordingly, it is possible to obtain the unit laminated body 35 that includes the unit base member 22 made of glass, the element portion 70 provided on the first surface 22a side of the unit base member 22, the first protective film 81, which is provided on the first surface 22a of the unit base member 22 and covers the element portion 70, and the second protective film 82 provided on the second surface 22b of the unit base member 22 as illustrated in FIG. 6E(a).

FIG. 6E(b) is a cross-sectional view illustrating the unit laminated body 35 illustrated in FIG. 6E(a) in an enlarged manner. As illustrated in FIG. 6E(b), the first protective film 81 is configured to laterally protrude than the first surface 22a of the unit base member 22. In the same manner, the second protective film 82 is configured to laterally protrude than the second surface 22b of the unit base member 22. Such a relationship between the unit base member 22, and the first protective film 81 or the second protective film 82 is realized by continuing the etching step over the time of a degree that allows the unit base member 22 to be penetrated by etching from both sides of the first surface 22a and the second surface 22b of the unit base member 22 during the above-described cutting step using the etchant. Incidentally, in general, the etching isotropically proceeds in any of the depth direction and the horizontal direction at positions near the first surface 22a and the second surface 22b in the side surface 22c of the unit base member 22 in the etching step. Thus, the etching greatly proceeds in the side surface 22c of the unit base member 22 near the first surface 22a and the second surface 22b as compared to an intermediate position between the first surface 22a and the second surface 22b as illustrated in FIG. 6E(b). As a result, it is possible to obtain the first side surface 22d, which intersects the edge 22ae and spreads outward as approaching the second surface 22b side, and the second side surface 22e which intersects the edge 22be and spreads outward as approaching the first surface 22a side.

Next, a description will be given regarding a step for obtaining the cover glass 20 with the reinforced side surface by providing the reinforcing portion (resin or the like) on the side surface 22c of the unit base member 22 of the unit laminated body 35 with reference to FIGS. 7A to 7D.

Figure 7A:
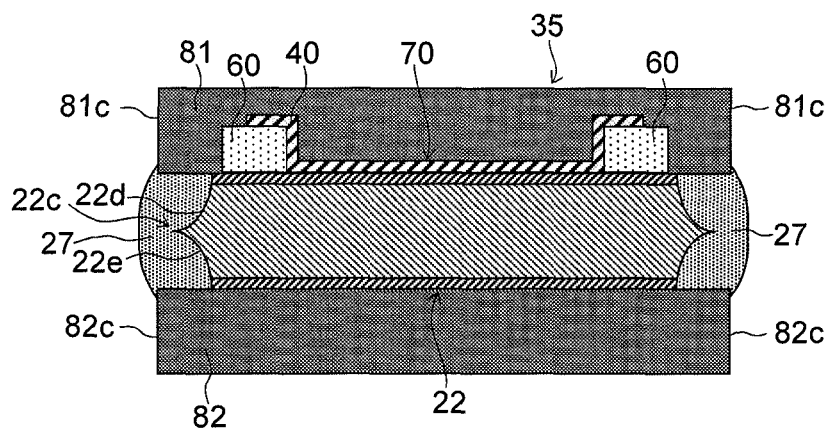
FIG. 7A is a diagram illustrating a part of a step of obtaining the cover glass having a reinforced side surface by providing resin on the side surface of the unit base member of the unit laminated body.

First, a coating step is performed in which a coating liquid 27 including a curable material such as a UV-curable resin or a thermosetting resin is applied on the side surface 22c of the unit base member 22 as illustrated in FIG. 7A. Here, a description will be given regarding the case of using the coating liquid including the acrylic resin and the photopolymerization initiator.

In the coating step, a space, which is surrounded by the side surface 22c of the unit base member 22, the first protective film 81 and the second protective film 82 is filled with the coating liquid 27 as illustrated in FIG. 7A. Incidentally, the coating liquid 27 may be applied at a degree of being spilled out also onto an end surface 81c of the first protective film 81 and onto an end surface 82c of the second protective film 82 as illustrated in FIG. 7A.

Figure 7B:
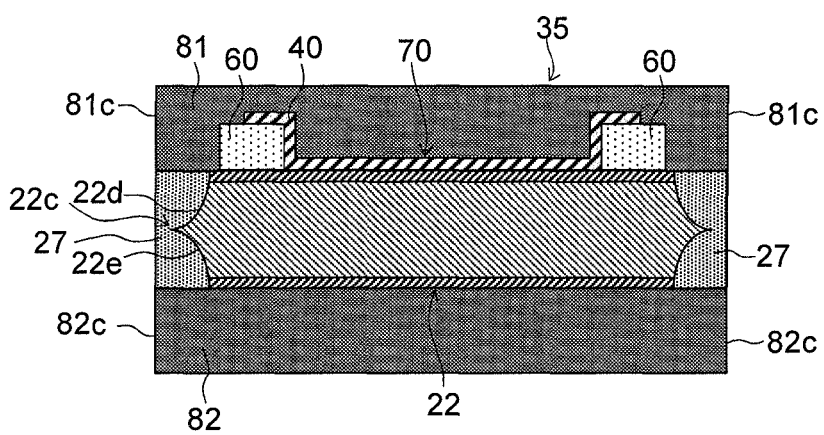
FIG. 7B is a diagram illustrating a part of the step of obtaining the cover glass having the reinforced side surface by providing the resin on the side surface of the unit base member of the unit laminated body.

Next, the coating liquid 27 spilled out onto the end surface 81c of the first protective film 81 and onto the end surface 82c of the second protective film 82 is scrapped off using a squeegee or the like. Accordingly, the surface of the coating liquid 27 matches the end surface 81c of the first protective film 81 and the end surface 82c of the second protective film 82 as illustrated in FIG. 7B. That is, a position of an edge of a liquid surface of the coating liquid 27 on the first protective film 81 side matches a position of the end surface 81c of the first protective film 81, and a position of an edge of a liquid surface of the coating liquid 27 on the second protective film 82 side matches a position of the end surface 82c of the second protective film 82.

Thereafter, a curing step is performed in which the coating liquid 27 provided on the side surface 22c of the unit base member 22 is cured. Here, the coating liquid 27 is cured by irradiating the coating liquid 27 with light such as an ultraviolet ray. Accordingly, the reinforcing portion 26 is formed on the side surface 22c of the unit base member 22.

Figure 7C:
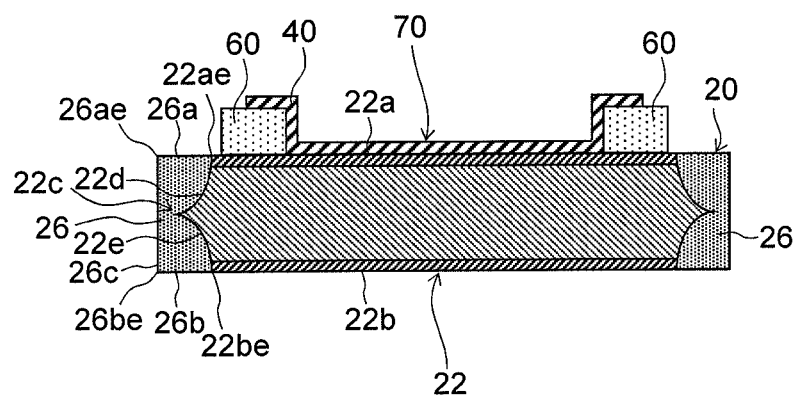
FIG. 7C is a diagram illustrating a part of the step of obtaining the cover glass having the reinforced side surface by providing the resin on the side surface of the unit base member of the unit laminated body.
Figure 7D:
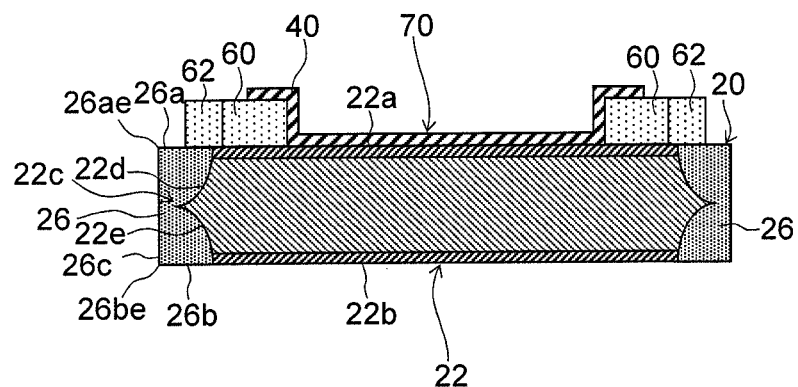
FIG. 7D is a diagram illustrating a part of the step of obtaining the cover glass having the reinforced side surface by providing the resin on the side surface of the unit base member of the unit laminated body.

Next, the first protective film 81 on the first surface 22a of the unit base member 22, and the second protective film 82 on the second surface 22b of the unit base member 22 are removed. Accordingly, it is possible to obtain the cover glass 20 which is provided with the unit base member 22 and the reinforcing portion 26 provided on the side surface 22c of the unit base member 22 as illustrated in FIG. 7C. Thereafter, an additional decorative layer 62 may be provided at a position on the outer side of the decorative portion 60 while being on the first surface 22a side of the unit base member 22 or the first surface 26a side of the reinforcing portion 26 as illustrated in FIG. 7D. The additional decorative layer 62 is configured to exhibit the same color as the decorative portion 60. When the above-described additional decorative layer 62 is further provided, it is possible to acquire improvement of the design effect such as prevention of light leakage from the outer peripheral portion by further expanding the range of the non-active area Aa2 to enable exhibition of a desired color. In addition, it is preferable that the additional decorative layer 62 is configured to overlap the reinforcing portion 26 when seen in the normal direction of the first surface 20a of the cover glass 20.

According to the present embodiment, the reinforcing portion 26 including the curable resin is provided on the side surface 22c of the unit base member 22. Thus, when the impact is applied to the side surface 20c of the cover glass 20, the force transferred to the side surface 22c of the unit base member 22 is mitigated by the reinforcing portion 26, and thus, it is possible to suppress the generation of the damage such as the crack in the side surface 22c of the unit base member 22. Accordingly, it is possible to sufficiently enhance the impact resistance of the cover glass 20 even in a case in which the compressive stress layer is not formed at the side surface 22c of the unit base member 22. In addition, even in a case in which the tensile stress layer 24b is exposed to the side surface 22c of the unit base member 22, it is possible to cover the exposed tensile stress layer 24b with the reinforcing portion 26, and thus, it is possible to sufficiently enhance the impact resistance of the cover glass 20.

In addition, the reinforcing portion 26 is formed inside the space positioned by the first protective film 81 laterally protruding from the first surface 22a of the unit base member 22 and the second protective film 82 laterally protruding from the second surface 22b of the unit base member 22 in the present embodiment as described above. Thus, the first surface 22a of the unit base member 22 and the first surface 26a of the reinforcing portion 26 are positioned on the same plane as illustrated in FIGS. 7C and 7D. In the same manner, the second surface 22b of the unit base member 22 and the second surface 26b of the reinforcing portion 26 are positioned on the same plane. That is, a difference in level is completely or almost not present between the unit base member 22 and the reinforcing portion 26. Thus, it is possible to suppress a boundary between the unit base member 22 and the reinforcing portion 26 from being visually recognized by the observer. Accordingly, it is possible to secure both the strength of the side surface 20c of the cover glass 20 and the design effect of the cover glass 20 according to the reinforcing portion 26 of the present embodiment. In addition, the feeling of operating the touch panel is not inhibited by the difference in level.

In addition, the side surface 26c of the reinforcing portion 26 is aligned in the reinforcing portion 26 by scrapping off the coating liquid 27, which has been spilled out onto the end surface 81c of the first protective film 81 and the end surface 82c of the second protective film 82, using a squeegee or the like, in the present embodiment as described above. Thus, the position of the edge 26ae of the first surface 26a matches the position of the end surface 81c of the first protective film 81 in the reinforcing portion 26, which is obtained by curing the coating liquid 27. In the same manner, the position of the edge 26be of the second surface 26b of the reinforcing portion 26 matches the position of the end surface 82c of the second protective film 82. As described above, it is possible to determine the position of the edge 26ae of the first surface 26a and the position of the edge 26be of the second surface 26b of the reinforcing portion 26 based on the positions of the end surfaces 81c and 82c of the protective films 81 and 82 according to the present embodiment.

As described above, the reinforcing portion 26 is formed using the coating liquid 27 with a predetermined liquidity. Accordingly, it is difficult to precisely control a dimension such as a thickness and a shape of the coating liquid 27 if the coating liquid 27 is applied without using a frame such as the protective films 81 and 82. Meanwhile, the positions of the end surfaces 81c and 82c of the protective films 81 and 82 are determined with high accuracy through processing using the mold or the laser as described above. Accordingly, it is possible to realize the accuracy conforming to the accuracy of the processing using the mold or the laser as the accuracy in the dimension such as the thickness and the shape of the coating liquid 27 according to the present embodiment. Thus, it is possible to accurately set the positions of the edges 26ae and 26be of the reinforcing portion 26, that is, the position of the edge of the cover glass 20 according to the present embodiment. Accordingly, it is possible to enhance the ease and yield of the process at the time of assembling the cover glass 20, the display device 15, and the case. In addition, it is also possible to enhance the processing accuracy of the decorative portion 60 and the touch panel sensor unit 40 with respect to the display device 15 in a case in which the decorative portion 60 and the touch panel sensor unit 40 are provided in the cover glass 20 as in the present embodiment. Accordingly, it is possible to realize excellent design effect and operability of the cover glass-equipped display device 10.

In addition, when the side surface 26c of the reinforcing portion 26 is configured as the flat surface which substantially evenly spreads between the edge 26ae and the edge 26be, not only the positions of the edges 26ae and 26be of the reinforcing portion 26 but also a position of the entire side surface 26c of the reinforcing portion 26 is also set in response to the positions of the end surfaces 81c and 82c of the protective films 81 and 82. That is, it is possible to enhance the processing accuracy not only in the edge of the cover glass 20 but also in the entire side surface 20c of the cover glass 20.

In addition the side surface 20c of the cover glass 20 is formed using the reinforcing portion 26 including the resin according to the present embodiment, and thus, it is unnecessary to perform laceration prevention processing through chamfering or the like with respect to an edge portion of the side surface 20c of the cover glass 20 as compared to the case of forming the side surface 20c of the cover glass 20 using the glass.

In addition, it is preferable that the reinforcing portion 26 of the cover glass 20 is configured to exhibit the same color as the decorative portion 60 and the additional decorative layer 62 provided on the first surface 20a side of the cover glass 20. For example, the reinforcing portion 26 may include a coloring pigment having the same color as the coloring pigment included in the decorative portion 60 and the additional decorative layer 62. In this case, a region in the periphery of the outer frame of the non-active area Aa2 is visually recognized as a region having the same color as the region of the decorative portion 60 or the additional decorative layer 62 positioned on the inner side thereof. Thus, it is possible to obtain the same effect in design as those in a case in which the decorative portion 60 and the additional decorative layer 62 extend to the outer frame of the non-active area Aa2.

In general, the decorative portion 60 and the additional decorative layer 62 are formed by applying a coating liquid containing a resin material and pigments on the cover glass 20 (on the unit base member 22 or the reinforcing portion 26). Meanwhile, it is not easy to accurately coat the region in the periphery of the outer frame of the non-active area Aa2 with the coating liquid.

Here, when the reinforcing portion 26 is colored as described above, the region in the periphery of the outer frame of the non-active area Aa2 is visually recognized with the desired color without providing the decorative portion 60 and the additional decorative layer 62 even in the region in the periphery of the outer frame of the non-active area Aa2. Thus, it is possible to make the steps of providing the decorative portion 60 and the additional decorative layer 62 easier.

Incidentally, the "same color" means that chromaticity of two colors approximate each other to a degree in which a difference between the colors is hardly discriminated with the naked eye. To be more specific, the "same color" means that a color difference $\Delta E^*_{ab}$ between two colors is equal to or smaller than 10, and preferably, equal to or smaller than 3. In addition, "different colors" mean that a color difference $\Delta E^*_{ab}$ between two colors is larger than 10. Here, the color difference $\Delta E^*_{ab}$ indicates a value which is calculated based on L*, a* and b* in the L*a*b* color system, and is a value serving as an index relating to a difference in color in the case of observation with the naked eye.

Incidentally, it is possible to add various alterations with respect to the embodiment described above. Hereinafter, several modified examples will be described with reference to the drawings. In the following description and drawings to be used in the following description, parts that can be configured in the same manner as the above-described embodiment will be represented by the same reference signs as the reference sings which have been used for the corresponding parts in the above-described embodiment, and the repeated description will be omitted. In addition, when it is apparent that it is possible to obtain the operational effect, which can be obtained in the embodiment described above, even in the modified example, the description thereof will be omitted.

(First Modified Example)

Figure 8A:
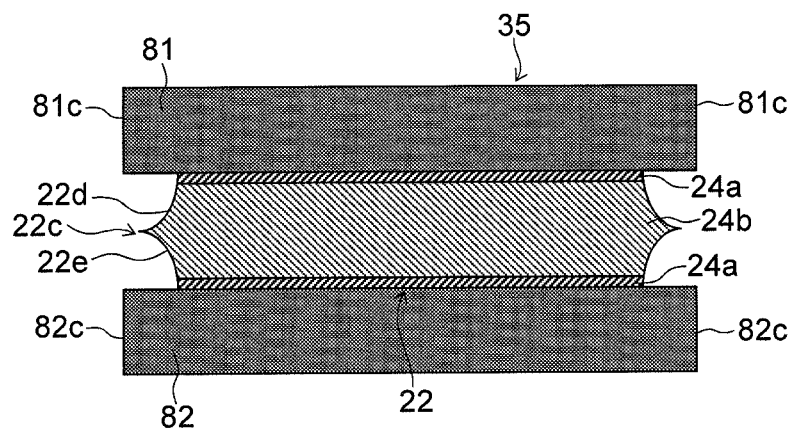
FIG. 8A is a cross-sectional view illustrating a unit laminated body according to a first modified example of the present embodiment.
Figure 8B:
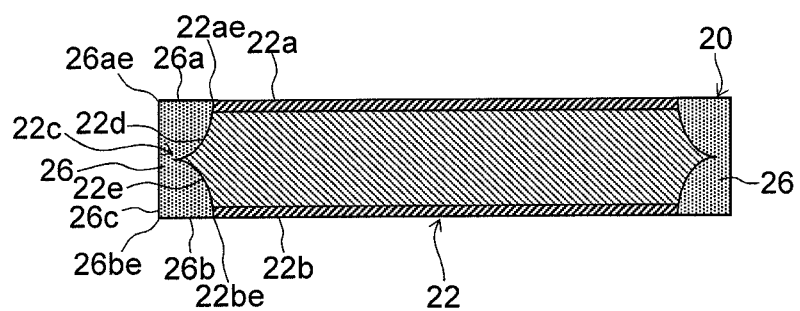
FIG. 8B is a cross-sectional view illustrating a cover glass according to the first modified example of the present embodiment.

In the above-described present embodiment, the example has been illustrated in which the element portion forming step of forming the element portion 70, which includes the decorative portion 60, the touch panel sensor unit 40 and the like, on the first surface 30a of the base member 30 is performed prior to the protective film forming step of providing the first protective film 81 and the second protective film 82 in the base member 30. However, the first protective film 81 and the second protective film 82 may be provided with respect to the base member 30 in a state in which the element portion 70 is not provided. FIG. 8A is a cross-sectional view illustrating the unit laminated body 35 which is obtained by cutting the base member 30 in which the element portion 70 is not provided along each clearance of the first protective film 81 and the second protective film 82. Even in this case, the space surrounded by the side surface 22c of the unit base member 22, the first protective film 81, and the second protective film 82 is filled with the coating liquid 27, and it is possible to obtain the cover glass 20 that includes the reinforcing portion 26 provided on the side surface 22c of the unit base member 22 as illustrated in FIG. 8B. Thereafter, the decorative portion 60 and the touch panel sensor unit 40 may be formed on the first surface 20a of the cover glass 20. Alternatively, it may be configured such that the decorative portion 60 and the touch panel sensor unit 40 are individually formed, and then, are combined using an adhesive or the like, to form the cover glass 20, and then, the resultant is combined with the display device 15.

The reinforcing portion 26 may be configured to exhibit a predetermined color in the first modified example illustrated in FIGS. 8A and 8B. For example, the reinforcing portion 26 may contain a coloring pigment to exhibit the predetermined color. In this case, it is possible to realize the improvement of the design effect such as the prevention of light leakage from the outer peripheral portion without providing the decorative portion 60 and the additional decorative layer 62.

(Second Modified Example)

Figure 9A:
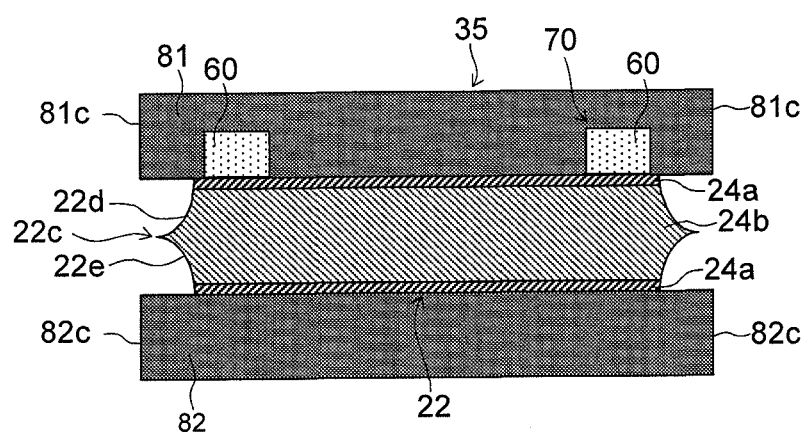
FIG. 9A is a cross-sectional view illustrating a unit laminated body according to a second modified example of the present embodiment.
Figure 9B:
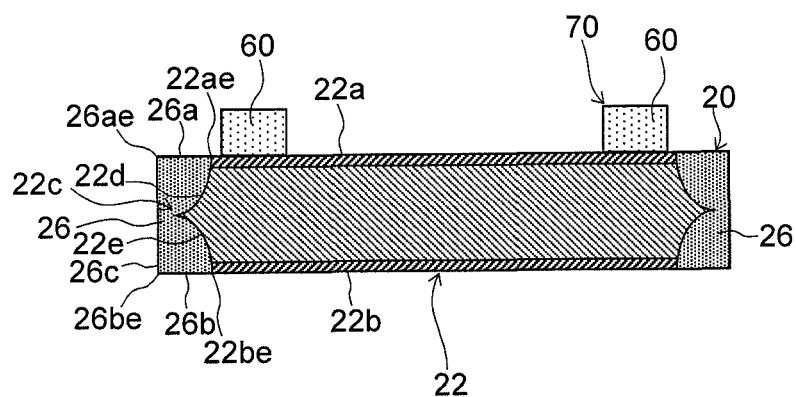
FIG. 9B is a cross-sectional view illustrating a cover glass according to the second modified example of the present embodiment.

In the above-described first modified example, the example has been illustrated in which the first protective film 81 and the second protective film 82 are provided with respect to the base member 30 in a state in which none of the decorative portion 60 and the touch panel sensor unit 40 are provided. However, the first protective film 81 and the second protective film 82 may be provided with respect to the base member 30 in a state in which the touch panel sensor unit 40 is not provided but the decorative portion 60 is provided. FIG. 9A is a cross-sectional view illustrating the unit laminated body 35 which is obtained by cutting the base member 30 in which the decorative portion 60 is provided along each clearance of the first protective film 81 and the second protective film 82. Even in this case, it is possible to obtain the cover glass 20 provided with the reinforcing portion 26, which is provided on the side surface 22c of the unit base member 22, as illustrated in FIG. 9B, by filling the space surrounded by the side surface 22c of the unit base member 22, the first protective film 81, and the second protective film 82 with the coating liquid 27. Thereafter, the touch panel sensor unit 40 may be formed on the first surface 20a of the cover glass 20. Alternatively, it may be configured such that the touch panel sensor unit 40 is individually formed, and then, is combined using an adhesive or the like, to form the cover glass 20, and then, the resultant is combined with the display device 15.

(Third Modified Example)

Figure 10A:
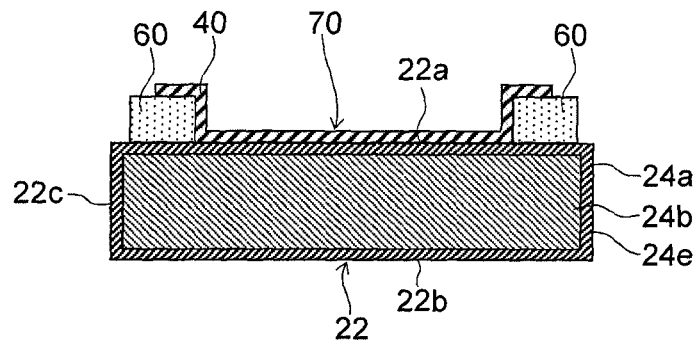
FIG. 10A is a diagram illustrating a unit base member before being provided with a reinforcing portion in a third modified example of the present embodiment.

In the above-described present embodiment, the example has been illustrated in which the protective film forming step of providing the first protective film 81 and the second protective film 82 in the base member 30 is performed prior to the cutting step of cutting the base member 30 and obtaining the unit base member 22. However, the first protective film 81 and the second protective film 82 may be provided on the first surface 22a and the second surface 22b of the unit base member 22 after cutting the base member 30 and obtaining the unit base member 22. In this case, it is possible to use a unit base member in which the compressive stress layer 24a is formed at not only the first surface 22a and the second surface 22b of the unit base member 22 but also the side surface 22c, as illustrated in FIG. 10A, as the unit base member 22

Figure 10B:
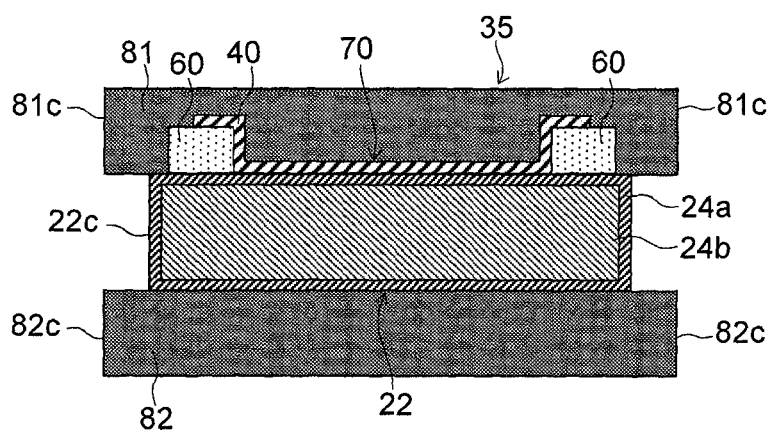
FIG. 10B is a cross-sectional view illustrating a unit laminated body according to the third modified example of the present embodiment.
Figure 10C:
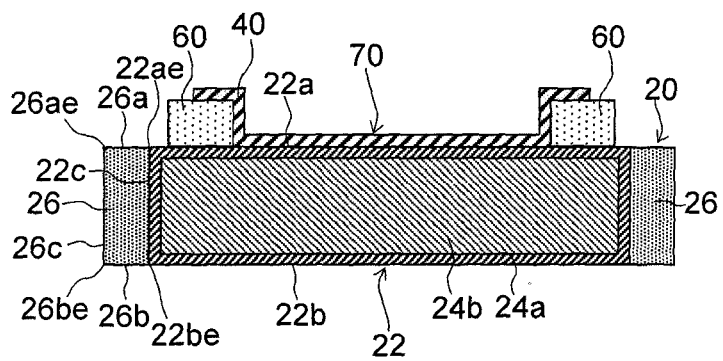
FIG. 10C is a cross-sectional view illustrating a cover glass according to the third modified example of the present embodiment.

Incidentally, it is effective to provide the reinforcing portion 26 on the side surface 22c of the unit base member 22 when the impact is applied to the side surface 20c of the cover glass 20 even in a case in which the side surface 22c of the unit base member 22 is formed using the compressive stress layer 24a, in order to mitigate the force transferred to the side surface 22c of the unit base member 22. First, the first protective film 81 and the second protective film 82 are provided on the first surface 22a and the second surface 22b of the unit base member 22, as illustrated in FIG. 10B, in order to provide the reinforcing portion 26 on the side surface 22c. The first protective film 81 and the second protective film 82 are provided to laterally protrude from the first surface 22*a* and the second surface 22*b* of the unit base member 22 as illustrated in FIG. 10B. Thereafter, the space surrounded by the side surface 22*c* of the unit base member 22, the first protective film 81, and the second protective film 82 is filled with the coating liquid 27, and further, the coating liquid 27 is cured, whereby, it is possible to obtain the cover glass 20 provided with the reinforcing portion 26 provided on the side surface 22*c* of the unit base member 22 as illustrated in FIG. 10C.

Incidentally, the decorative portion 60 and the touch panel sensor unit 40 may be formed on the first surface 20*a* side of the cover glass 20 after obtaining the cover glass 20 also in the present modified example similarly to the cases of the first modified example and the second modified example described above.

(Fourth Modified Example)

Figure 11:
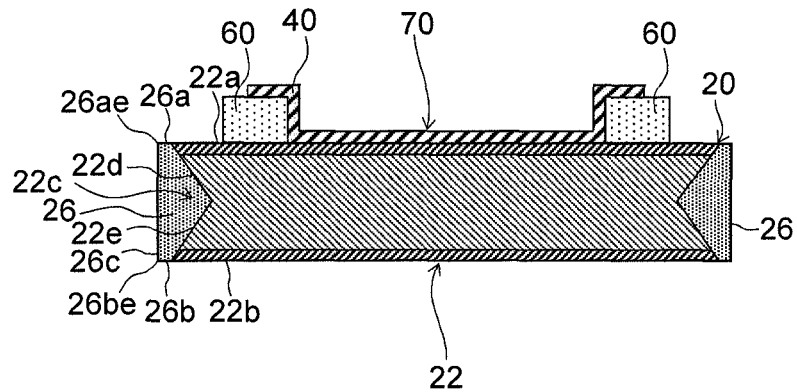
FIG. 11 is a cross-sectional view illustrating a cover glass according to a fourth modified example of the present embodiment.

In the above-described present embodiment, the example has been illustrated in which the first side surface 22*d* of the unit base member 22 intersects the edge 22*ae* of the first surface 22*a* of the unit base member 22 and spreads outward as approaching the second surface 22*b* side of the unit base member 22, and further, the second side surface 22*e* of the unit base member 22 intersects the edge 22*be* of the second surface 22*b* of the unit base member 22, spreads outward as approaching the first surface 22*a* side of the unit base member 22, and then is merged into the first side surface 22*d*. That is, the example has been illustrated in which the side surface 22*c* of the unit base member 22 has a convex shape to protrude toward the outer side. However, the side surface 22*c* of the unit base member 22 may have a concave shape to be recessed toward the inner side, as illustrated in FIG. 11. In this case, it is possible to obtain the cover glass 20 with high contour accuracy by molding the reinforcing portion 26 using the first protective film 81 and the second protective film 82 similarly to the case of the above-described present embodiment.

(Fifth Modified Example)

Figure 12:
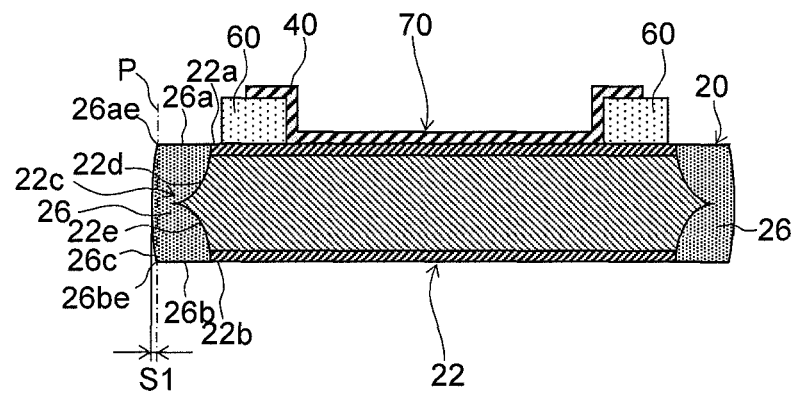
FIG. 12 is a cross-sectional view illustrating a cover glass according to a fifth modified example of the present embodiment.

In the above-described present embodiment, the example has been illustrated in which the side surface 26*c* of the reinforcing portion 26 is configured as the flat surface, which substantially evenly spreads between the edge 26*ae* and the edge 26*be*. However, the side surface 26*c* of the reinforcing portion 26 may protrude than a virtual plane P passing the edge 26*ae* of the first surface 26*a* and the edge 26*be* of the second surface 26*b* of the reinforcing portion 26, as illustrated in FIG. 12. In this case, it is possible to allow the reinforcing portion 26 to cover the side surface 22*c* of the unit base member 22 more thickly as compared to a case in which the side surface 26*c* of the reinforcing portion 26 is flat, and thus, it is possible to more effectively protect the side surface 22*c* of the unit base member 22.

In FIG. 12, a protruding amount of the side surface 26*c* with respect to the plane P is represented by reference sign S1. The protruding amount S1 is suitably set according to the contour accuracy to be acquired for the cover glass 20, and, for example, the protruding amount S1 is set to be equal to or smaller than 500 μm.

(Sixth Modified Example)

Figure 13:
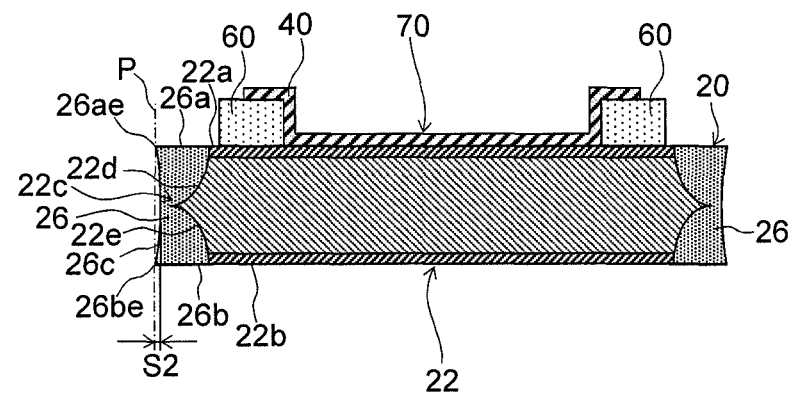
FIG. 13 is a cross-sectional view illustrating a cover glass according to a sixth modified example of the present embodiment.

In the above-described fifth modified example, the example has been illustrated in which the side surface 26*c* of the reinforcing portion 26 protrudes than the virtual plane P passing the edge 26*ae* of the first surface 26*a* and the edge 26*be* of the second surface 26*b* of the reinforcing portion 26, but the invention is not limited thereto. As illustrated in FIG. 13, the side surface 26*c* of the reinforcing portion 26 may be recessed than the virtual plane P. That is, the edge 26*ae* of the first surface 26*a* and the edge 26*be* of the second surface 26*b* of the reinforcing portion 26 may laterally protrude than the side surface 26*c*. In this case, the impact from the outside is easily applied to the edges 26*ae* and 26*be* than the side surface 26*c*.

It is considered that a part, which is most likely to be damaged in the side surface 22*c* of the unit base member 22, is a part in which the first side surface 22*d* and the second side surface 22*e* are merged in the example illustrated in FIG. 13. The reason is because there is a high possibility that the merging portion of the first side surface 22*d* and the second side surface 22*e* laterally protrude, and the merging portion is positioned in the tensile stress layer 24*b* in the case of cutting the base member 30 using the wet etching. Meanwhile, this merging portion is generally positioned at a location, which is spaced apart from the edge 26*ae* and the edge 26*be*, for example, a location in the middle between the edge 26*ae* and the edge 26*be*. Here, the impact from the outside is likely to apply to the edges 26*ae* and 26*be* according to the present modified example, and thus, it is possible to suppress the impact from affecting the above-described merging portion positioned at the location spaced apart from the edges 26*ae* and 26*be*. Thus, it is possible to more effectively prevent the damage of the side surface 22*c* of the unit base member 22.

In FIG. 13, a recessed amount of the side surface 26*c* with respect to the plane P is represented by reference sign S2. The recessed amount S2 is suitably set according to the contour accuracy to be acquired for the cover glass 20, and, for example, the recessed amount S2 is set to be equal to or smaller than 200 μm.

(Seventh Modified Example)

Figure 14:
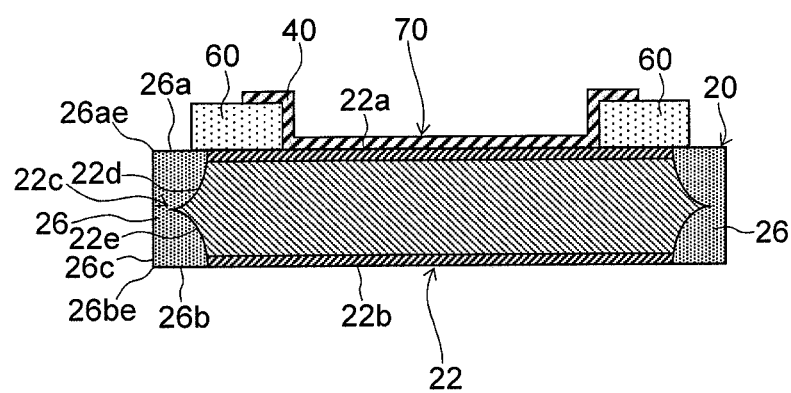
FIG. 14 is a cross-sectional view illustrating a cover glass according to a seventh modified example of the present embodiment.

In the above-described present embodiment, the example has been illustrated in which the decorative portion 60 and the reinforcing portion 26 do not overlap each other when seen along the normal direction of the first surface 20*a* of the cover glass 20. However, the decorative portion 60 and the reinforcing portion 26 may overlap each other when seen along the normal direction of the first surface 20*a* of the cover glass 20, as illustrated in FIG. 14. In this case, the region in the periphery of the outer frame of the non-active area Aa2 can be visually recognized in a desired color without providing the additional decorative layer 62 described above. Thus, it is possible to reduce labor and cost required for manufacturing of the cover glass 20 as compared to the case of providing the additional decorative layer 62.

(Modified Example of Protective Film)

Figure 15A:
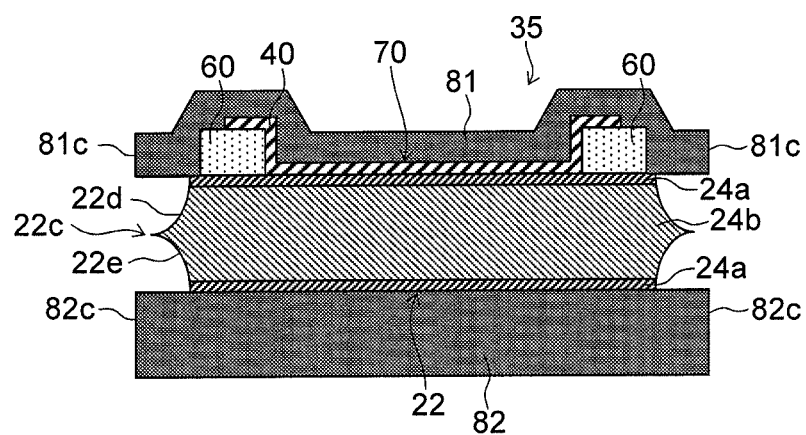
FIG. 15A is a diagram illustrating an aspect that a shape of a first protective film follows shapes of a decorative portion and a touch panel sensor unit on the unit base member.

In the above-described present embodiment, the example has been illustrated in which an outer surface of the first protective film 81 (the surface on the opposite side of a surface on the unit base member 22 side among surfaces of the first protective film 81) is flat, for example, as illustrated in FIG. 6E(b). However, it is considered that the outer surface of the first protective film 81 has a shape following each shape of the decorative portion 60 and the touch panel sensor unit 40 on the unit base member 22, as illustrated in FIG. 15A, in a case in which the first protective film 81 is configured using a photosensitive resist film.

Figure 15B:
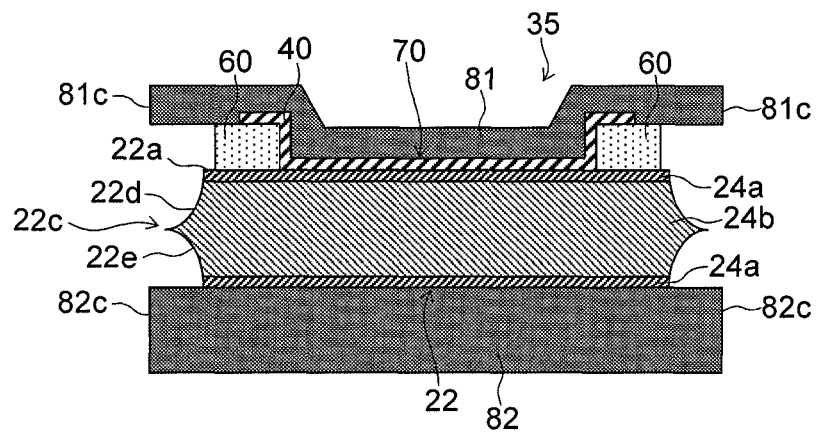
FIG. 15B(a) is a diagram illustrating an example of the unit laminated body in a case in which the shape of the first protective film is incapable of following the shapes of the decorative portion and the touch panel sensor unit on the unit base member, and FIG. 15B(b) is a diagram illustrating the cover glass which is obtained from the unit laminated body illustrated in FIG. 15B(a).
Figure 15B:
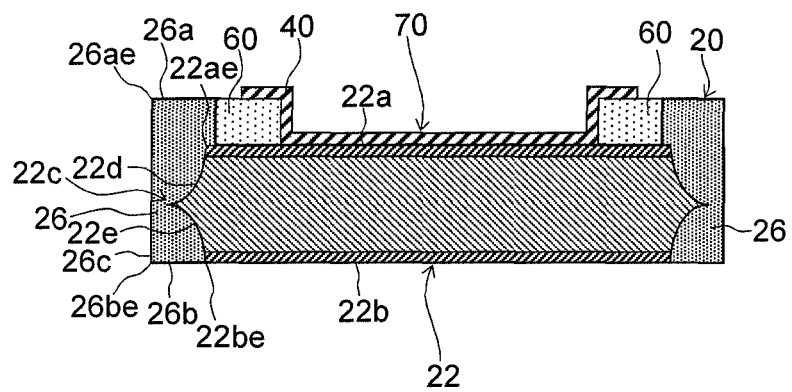

Incidentally, there is a case in which it is difficult to make the shape of the first protective film 81 follow the shapes of the decorative portion 60 and the touch panel sensor unit 40 on the unit base member 22, and as a result, a clearance is formed between the first protective film 81 and the first surface 22*a* of the unit base member 22, as illustrated in FIG. 15B(a), when the thickness of the decorative portion 60 is large (for example, when the decorative portion 60 is a white-based object) or when a distance from an outer edge of the decorative portion 60 to the end surface 81c of the first protective film 81 is short. In this case, the first surface 26a of the reinforcing portion 26 is not present on the same plane as the first surface 22a of the unit base member 22 as illustrated in FIG. 15B(b). Incidentally, even in the example illustrated in FIGS. 15B(a) and 15B(b), the position of the edge 26ae of the reinforcing portion 26 matches the position of the end surface 81c of the first protective film 81 similarly to the case of the above-described present embodiment. That is, it is possible to accurately set the position of the edge 26ae of the reinforcing portion 26, that is, the position of the edge of the cover glass 20 even in the present modified example.

Figure 15C:
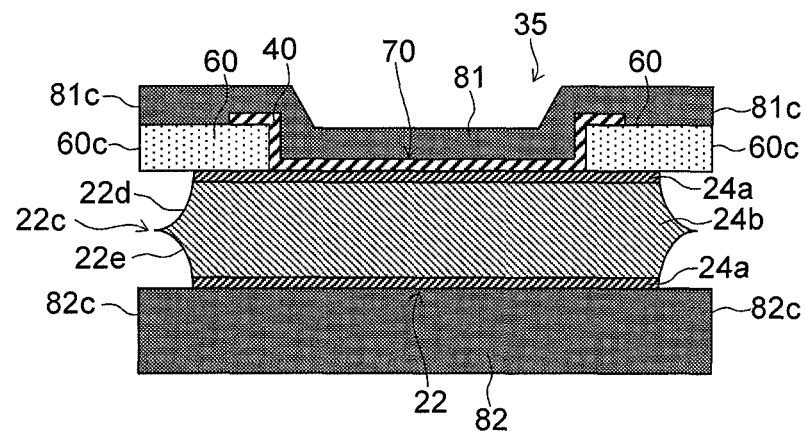
FIG. 15C(a) is a diagram illustrating an example of the unit laminated body in a case in which the shape of the first protective film is incapable of following the shapes of the decorative portion and the touch panel sensor unit on the unit base member, and FIG. 15C(b) is a diagram illustrating the cover glass which is obtained from the unit laminated body illustrated in FIG. 15C(a).
Figure 15C:
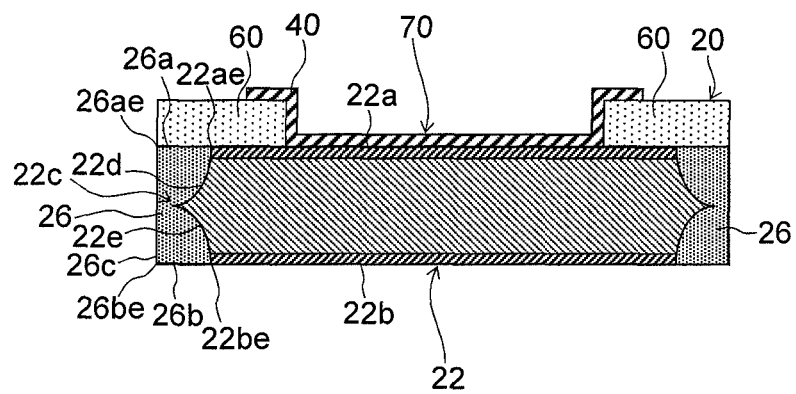

Incidentally, when it is difficult to make the shape of the first protective film 81 follow the shapes of the decorative portion 60 and the touch panel sensor unit 40 on the unit base member 22, the decorative portion 60 may be configured such that an end surface 60c of the decorative portion 60 projects out to the outer side than the side surface 22c of the unit base member 22 as illustrated in FIG. 15C(a). In this case, a space surrounded by the side surface 22c of the unit base member 22, the decorative portion 60, and the second protective film 82 is filled with the coating liquid for formation of the reinforcing portion 26. Thus, it is possible to obtain the cover glass 20 in which the first surface 22a of the unit base member 22 and the first surface 26a of the reinforcing portion 26 are positioned on the same plane as illustrated in FIG. 15C(b). Incidentally, the position of the edge 26ae of the reinforcing portion 26 matches a position of the end surface 60c of the decorative portion 60 in the example illustrated in FIGS. 15C(a) and 15C(b). In addition, the decorative portion 60 is formed by a photolithographic method, in general. Accordingly, it is possible to realize the accuracy conforming to the accuracy in the photolithographic method as the accuracy in the dimension such as the thickness and the shape of the reinforcing portion 26 according to the present modified example. That is, it is possible to accurately set the position of the edge 26ae of the reinforcing portion 26, that is, the position of the edge of the cover glass 20 even in the present modified example.

(Modified Example of Configuration of Coating Liquid)

In addition, in the above-described present embodiment, the example has been illustrated in which the coating liquid 27 to be applied on the side surface 22c of the unit base member 22 contains the curable material such as the UV-curable resin or the thermosetting resin, but the invention is not limited thereto. Various types of fluid bodies can be used as the coating liquid 27 for formation of the reinforcing portion 26 as long as they have a predetermined liquidity at the time of being applied on the side surface 22c of the unit base member 22, and thereafter, are curable. For example, a fluid body including a resin material in the state of being melted by heat may be used as the coating liquid 27. In this case, the coating liquid 27 becomes hard as the coating liquid 27 is solidified as being cooled after the coating liquid 27 is applied on the side surface 22c of the unit base member 22. Accordingly, it is possible to obtain the reinforcing portion 26 containing the resin material. In this manner, the "curing" is a concept that includes not only a phenomenon in which a resin material is cured by heating, the ultraviolet irradiation or the like, but also a phenomenon in which a resin material is cured as being cooled and solidified in the present embodiment. Incidentally, the resin material may be cooled and solidified by natural cooling, or the resin material may be cooled and solidified by forced cooling. In addition, the "solidification" means that a substance is changed from the state of gas or liquid into the state of solid.

(Modified Example of Application Range of Coating Liquid)

Figure 16A:
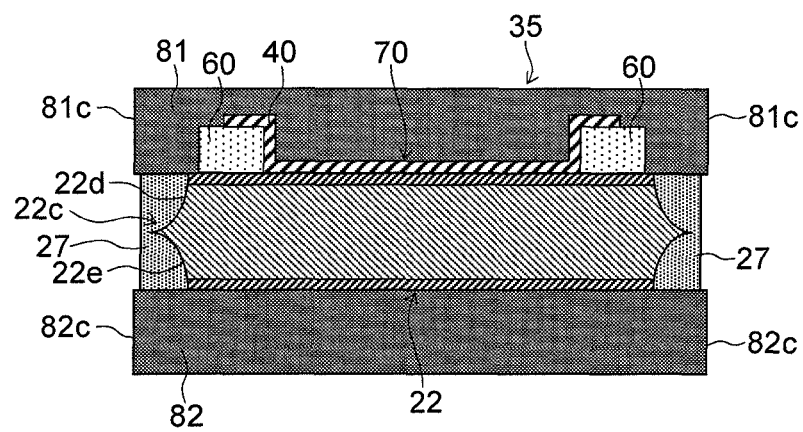
FIG. 16A is a diagram illustrating an example in which a coating liquid is applied not to reach an end surface of the protective film.
Figure 16B:
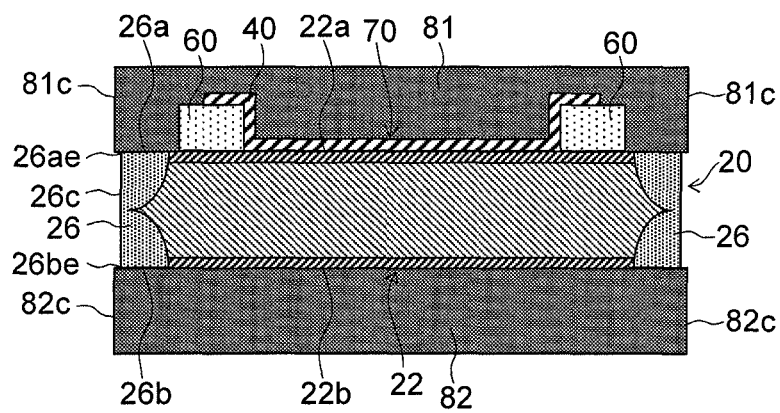
FIG. 16B is a diagram illustrating the cover glass which is provided with the reinforcing portion formed using the coating liquid illustrated in FIG. 16A.

In addition, in the above-described present embodiment, the example has been illustrated in which the space surrounded by the side surface 22c of the unit base member 22, the first protective film 81, and the second protective film 82 is filled with the coating liquid 27 until the surface of the coating liquid 27 matches the end surface 81c of the first protective film 81 and the end surface 82c of the second protective film 82 or is positioned on the outer side than the end surfaces 81c and 82c, but the invention is not limited thereto. For example, the coating liquid 27 may be applied into the space surrounded by the side surface 22c of the unit base member 22, the first protective film 81, and the second protective film 82 such that the surface thereof is positioned at the inner side than the end surface 81c of the first protective film 81 and the end surface 82c of the second protective film 82 in the coating step as illustrated in FIG. 16A. In this case, the edge 26ae and the edge 26be of the reinforcing portion 26, which are formed from the coating liquid 27, are positioned at the inner side (the unit base member 22 side) than the end surface 81c of the first protective film 81 and the end surface 82c of the second protective film 82 as illustrated in FIG. 16B.

Even in the present modified example, the first surface 22a of the unit base member 22 and the first surface 26a of the reinforcing portion 26 are positioned on the same plane. In the same manner, the second surface 22b of the unit base member 22 and the second surface 26b of 26 are positioned on the same plane. That is, a difference in level is completely or almost not present between the unit base member 22 and the reinforcing portion 26. Thus, it is possible to suppress a boundary between the unit base member 22 and the reinforcing portion 26 from being visually recognized by the observer. Accordingly, it is possible to secure both the strength of the side surface 20c of the cover glass 20 and the design effect of the cover glass 20 according to the reinforcing portion 26 of the present embodiment. In addition, the feeling of operating the touch panel is not inhibited by the difference in level.

In addition, the coating liquid 27 for formation of the reinforcing portion 26 is applied into the space surrounded by the side surface 22c of the unit base member 22, the first protective film 81, and the second protective film 82 even in the present modified example. Here, an interval between the first protective film 81 and the second protective film 82 is constant. Accordingly, a position of the surface of the coating liquid 27 to be applied into a space surrounded by the first protective film 81 and the second protective film 82, and further, positions of the side surface 26c, the edge 26ae and the edge 26be of the reinforcing portion 26 are uniquely set depending on an application amount of the coating liquid 27. Thus, it is possible to precisely set the positions of the side surface 26c and the edges 26ae and 26be of the reinforcing portion 26 by appropriately adjusting the application amount of the coating liquid 27 to be applied into the space surrounded by the first protective film 81 and the second protective film 82. That is, it is possible to provide the cover glass 20 which is provided with the side surface 20c formed at the high external dimensional accuracy.

(Example Relating to Disposition of Reinforcing Portion)

Figure 17:
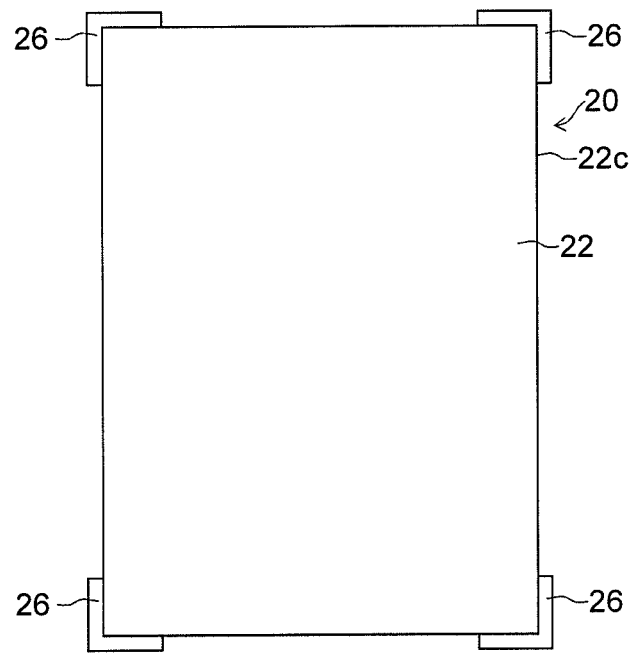
FIG. 17 is a diagram illustrating an example in which the reinforcing portion is formed on four corners of the unit base member.
Figure 18:
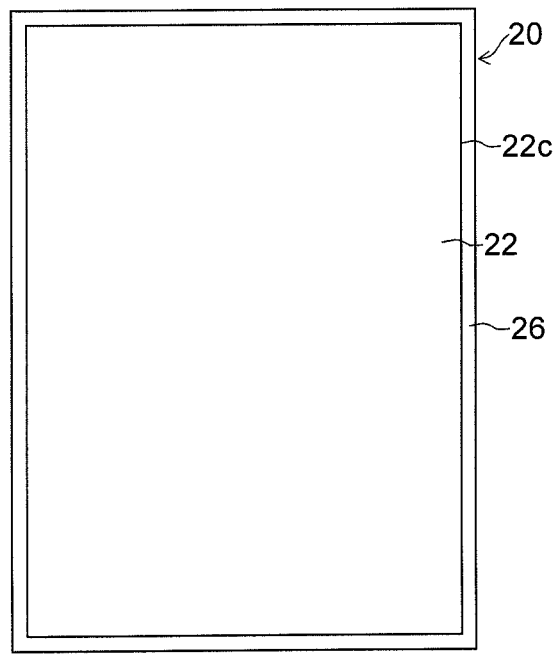
FIG. 18 is a diagram illustrating an example in which the reinforcing portion is formed to surround the unit base member.
Figure 19:
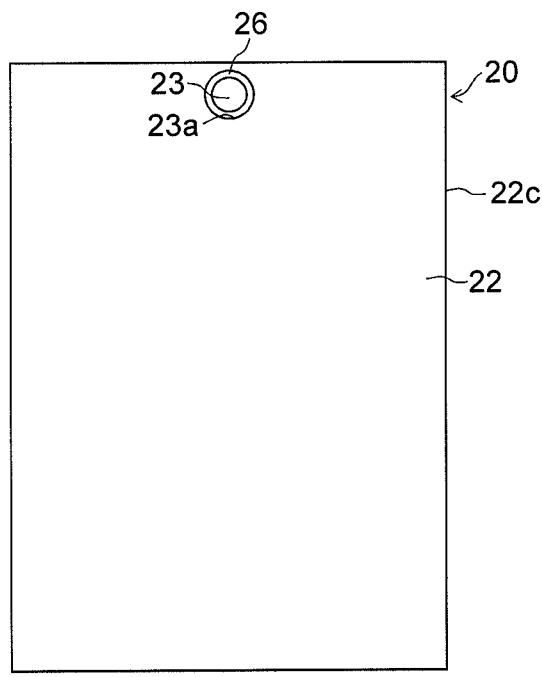
FIG. 19 is a diagram illustrating an example in which the reinforcing portion is formed on a wall surface of a through-hole which is formed in the unit base member.

A specific disposition of the reinforcing portion 26 is not particularly limited as long as the reinforcing portion 26 is formed on the side surface 22c of the unit base member 22. Hereinafter, an example of disposition of the reinforcing portion 26 will be described with reference to FIGS. 17 to 19. FIGS. 17 to 19 illustrate plan views of the cover glass 20. Here, a description will be given regarding a case in which the unit base member 22 of the cover glass 20 has a rectangular shape when seen in a plan view.

In general, four corners of the cover glass 20 are parts with highest frequencies of being applied with the impact in the rectangular-shaped cover glass 20. On consideration of this point, the reinforcing portion 26 may be provided in a part including four corners of the unit base member 22 in the side surface 22c of the unit base member 22 as illustrated in FIG. 17. Incidentally, the four corners of the unit base member 22 are sharply pointed in the example illustrated in FIG. 17, but the four corners of the unit base member 22 may be in the state of being chamfered. For example, the four corners of the unit base member 22 may have angular surfaces or round surfaces.

In addition, the reinforcing portion 26 may be provided on the side surface 22c of the unit base member 22 such that the unit base member 22 is surrounded by the reinforcing portion 26 when seen in a plan view as illustrated in FIG. 18. Accordingly, the cover glass 20 is capable of withstanding with respect to the impact to be applied from various directions.

Incidentally, the example has been illustrated in which the reinforcing portion 26 is formed on the side surface 22c to form the contour of the unit base member 22 among side surfaces of the unit base member 22 in the above-described embodiment and the respective modified examples. However, the reinforcing portion 26 may be provided on a wall surface 23a of a through-hole 23 when the through-hole 23 is formed in the unit base member 22 as illustrated in FIG. 19. That is, a side surface of the unit base member 22 on which the reinforcing portion 26 is provided may be the wall surface 23a of the through-hole 23 formed in the unit base member 22. The through-hole 23 is provided to allow a camera, a speaker, or the like, for example, to be mounted to the display device.

Figure 20:
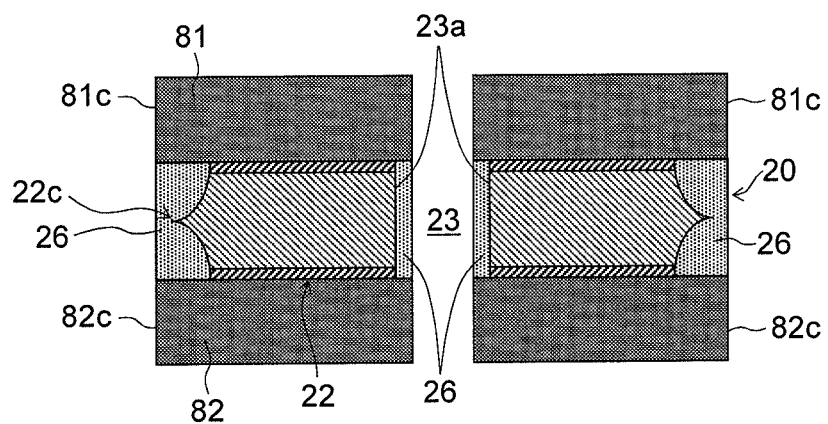
FIG. 20 is a diagram illustrating a step of forming a reinforcing portion on a wall surface of the through-hole illustrated in FIG. 19.

FIG. 20 is a cross-sectional view illustrating a step of forming the reinforcing portion 26 on the wall surface 23a of the through-hole 23 illustrated in FIG. 19. Incidentally, FIG. 20 illustrates an aspect in which the reinforcing portion 26 is formed not only on the wall surface 23a of the through-hole 23, but also on the side surface 22c forming the contour of the unit base member 22.

In the example illustrated in FIG. 20, the first protective film 81 and the second protective film 82 are provided to protrude to the inner side than the wall surface 23a of the through-hole 23 of the unit base member 22. Thus, it is possible to form the reinforcing portion 26 on the wall surface 23a at the high dimensional accuracy, as illustrated in FIG. 20, by applying the coating liquid 27 in a space surrounded by the wall surface 23a of the through-hole 23 of the unit base member 22, the first protective film 81 and the second protective film 82

(First Modified Example Relating to Material Forming Reinforcing Portion)

In the above-described present embodiment and the respective modified examples, the reinforcing portion 26 may be configured to control charging of the cover glass 20. For example, the reinforcing portion 26 may contain a conductive particle. Accordingly, it is possible to suppress the charging of the reinforcing portion 26 or the unit base member 22, and accordingly, it is possible to suppress generation of electrostatic breakdown. Examples of the conductive particle to be added in the reinforcing portion 26 can include a particle made of carbon black. Preferably, the conductive particle is added such that a surface resistance of the reinforcing portion 26 is within a range of $10^5$ to $10^8 \Omega/\square$.

Figure 21:
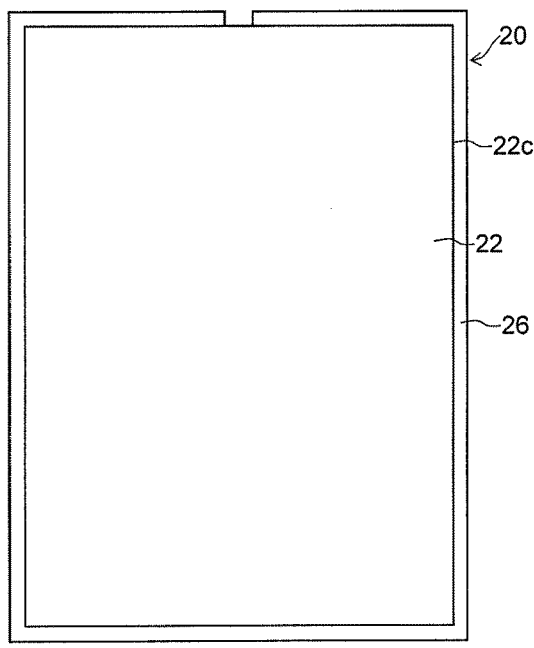
FIG. 21 is a diagram illustrating an example in which the reinforcing portion is formed not to completely surround the unit base member.

Incidentally, there is a risk that the reinforcing portion 26 serves as an antenna when the reinforcing portion 26 contains the conductive particle in a case in which the unit base member 22 is surrounded by the reinforcing portion 26 when seen in a plan view as in a modified example illustrated in FIG. 18. On consideration of this point, the reinforcing portion 26 may be configured so as not to completely surround the unit base member 22 when seen in a plan view as illustrated in FIG. 21. Accordingly, it is possible to suppress the reinforcing portion 26 from serving as the antenna to pick up noise, or serving as a noise source.

(Second Modified Example Relating to Material Forming Reinforcing Portion)

In the above-described present embodiment and the respective modified examples, the reinforcing portion 26 is formed by curing the coating liquid 27. Thus, when a significant shrinkage is caused at the time of curing of the coating liquid 27, the accuracy in the dimension of the reinforcing portion 26 is reduced. In addition, when the significant shrinkage is caused, an adhesion property between the reinforcing portion 26 and the side surface 22c of the unit base member 22 is also reduced. In addition, when the significant shrinkage is caused in the thickness direction of the unit base member 22 (the normal direction of the first surface 22a and the second surface 22b of the unit base member 22), a significant difference in level is generated between the first surface 22a and the second surface 22b of the unit base member 22 and the first surface 26a and the second surface 26b of the reinforcing portion 26, and as a result, the boundary between the unit base member 22 and the reinforcing portion 26 is likely to be visually recognized from the observer. Accordingly, it is preferable to use a material of which shrinkage at the time of being cured is as small as possible as the material to form the coating liquid 27 or the reinforcing portion 26. For example, it is preferable to use a material which is capable of suppressing each difference in level between each of the first surface 22a and the second surface 22b of the unit base member 22 and each of the first surface 26a and the second surface 26b of the reinforcing portion 26 to be within a range of 1 to 10 μm even when the shrinkage is caused at the time of curing.

Incidentally, the thickness of the compressive stress layer 24a is generally set to be within the range of 10 to 100 μm as described above. Therefore, a degree of the shrinkage becomes smaller than the thickness of the compressive stress layer 24a when the material having the small shrinkage at the time of being cured is selected so as to suppress the difference in level between the unit base member 22 and the reinforcing portion 26 to be within the range of 1 to 10 μm. Thus, it is possible to prevent the tensile stress layer 24b from exposing to the side surface 20c of the cover glass 20 even when the coating liquid 27 or the reinforcing portion 26 shrinks at the time of curing.

The inventors of the present application have repeated the intensive experiments, and as a result, it was possible to suppress each difference in level between each of the first surface 22a and the second surface 22b of the unit base member 22 and each of the first surface 26a and the second surface 26b of the reinforcing portion 26 to be within the range of 1 to 10 μm, more particularly, to be approximately 5 μm when a polyene-polythiol-based photocurable resin is used as the material to form the coating liquid 27 and the reinforcing portion 26. Incidentally, a thickness of the unit base member 22 used in the experiments was 700 μm.

A condition relating to a shrinkage ratio, which is required for the material to form the coating liquid 27 and the reinforcing portion 26, will be examined on the basis of the above-described results of experiments. Here, a shrinkage ratio in the thickness direction of the unit base member 22 (hereinafter, referred to also as a "thickness direction linear shrinkage ratio") will be examined. When each difference in level is caused by 10 μm between the first surface 22a and the second surface 22b of the unit base member 22 on both the first surface 26a side and the second surface 26b side of the reinforcing portion 26, a thickness direction linear shrinkage ratio at the time of curing of the coating liquid 27 becomes (10 μm×2/700 μm)×100=2.86%. In addition, when the difference in level is 5 μm, a thickness direction linear shrinkage ratio at the time of curing of the coating liquid 27 becomes (5 μm×2/700 μm)×100=1.43%. From this point of view, it is possible to say that it is required to use a material having the linear shrinkage ratio of being equal to or lower than 3%, and more preferably, equal to or lower than 1.5% as the material to form the coating liquid 27 in order to obtain the reinforcing portion 26 which includes the first surface 26a and the second surface 26b positioned on the same plane as the first surface 22a and the second surface 22b of the unit base member 22.

Incidentally, the coating liquid 27 was in contact with the side surface 22c of the unit base member 22 in the above-described experiments. Thus, it is considered that the side surface 22c of the unit base member 22 exerts a force in a direction to prevent the shrinkage with respect to the coating liquid 27 which is likely to shrink in the thickness direction of the unit base member 22 in the vicinity of the side surface 22c of the unit base member 22. Accordingly, it is considered that a thickness direction linear shrinkage ratio when the coating liquid 27, which is in contact with the side surface 22c, shrinks in the thickness direction of the unit base member 22 is smaller than a linear shrinkage ratio in another direction, a linear shrinkage ratio when the coating liquid 27, which is not in contact with the side surface 22c, shrinks. On consideration of this point, it is considered that it is possible to reliably obtain the reinforcing portion 26 which includes the first surface 26a and the second surface 26b positioned on the same plane as the first surface 22a and the second surface 22b of the unit base member 22 in the above-described present embodiment and the respective modified examples when a material having a linear shrinkage ratio of being equal to or lower than 3% in a single body is used. Incidentally, in general, a volume shrinkage ratio is obtained when the linear shrinkage ratio is cubed. Accordingly, a condition that a "linear shrinkage ratio is equal to or lower than 3%, and more preferably, equal to or lower than 1.5%" is converted into a condition that a "volume shrinkage ratio is approximately equal to or lower than 9%, and more preferably, approximately equal to or lower than 4.5%".

Hereinafter, the above-described polyene-polythiol-based photocurable resin will be described. The polyene-polythiol-based photocurable resin contains an enic compound, a thiol compound and a photopolymerization initiator. Such a polyene-polythiol-based photocurable resin has a smaller curing shrinkage than an acrylic photo-curable resin, and thus, has a high adhesion property with the base member, and further, does not receive the inhibition of polymerization caused by oxygen, which is advantageous.

The enic compound is a polyfunctional compound having two or more carbon-carbon double bonds in a single molecule, and examples thereof include vinyl ethers, vinyl esters, allyl ethers, allyl alcohol derivative, allyl isocyanurate derivative, styrenes, acrylic acid derivative, methacrylic acid derivative, divinylbenzene, and the like. When some of the above-described enic compounds are arranged in descending order in terms of reactivity with the thiol compound, it is arranged such that vinyl ethers, vinyl esters, allyl ethers, allyl isocyanurate derivative, acrylic acid derivative, and styrenes.

The thiol compound is a compound having two or more thiol groups in a single molecule, and examples thereof include esters with mercaptocarboxylic acid and polyhydric alcohol, aliphatic polythiols, aromatic polythiols, and other polythiols. One or two or more types thereof can be used.

Examples of the mercaptocarboxylic acid in the esters with the mercaptocarboxylic acid and the polyhydric alcohol described above include thioglycolic acid, α-mercaptopropionic acid, β-mercaptopropionic acid and the like.

A blending ratio between the enic compound (a) and the thiol compound (b) is preferably set such that a ratio between the number of unsaturated bonds in the enic compound (a) and the number of thiol groups in the thiol compound (b) is within a range of 2:1 to 1:2. When the thiol groups are many exceeding the ratio of 1:2, a lot of unreacted thiol groups remain in the composition after curing reaction, which is not preferable. When the thiol groups are smaller than the ratio of 2:1, it is not preferable in terms that the effect of the high adhesion property or the advantage of not receiving the inhibition of polymerization caused by the oxygen is reduced.

The photopolymerization initiator is not particularly limited, and a known photopolymerization initiator can be used. To be specific, for example, it is possible to use acetophenones (for example, 1-hiydroxy-cyclohexyl-phenyl-ketone which is commercially available as Product name: Irgacure 184 (manufactured by Ciba Specialty Chemicals Co.), benzophenones, thioxanthones, propiophenones, benzyls, acylphosphine oxides, benzoin, benzoin methyl ether or the like, alone or as a mixture thereof as the photopolymerization initiator in the case of resin having a radical-polymerizable unsaturated group.

It is preferable that the above-described photopolymerization initiator (c) is added at a proportion of 0.001 to 10 mass % with respect to the total amount of the above-described enic compound (a) and thiol compound (b). When the proportion is lower than 0.001 mass %, there is a risk of generating a problem that it is difficult to cause a sufficient photopolymerization reaction. In addition, even when the photopolymerization initiator is added to exceed the proportion of 10 mass %, the improvement of the effect is not confirmed.

Besides, it is considered to add filler in the material to form the coating liquid 27 and the reinforcing portion 26 in order to reduce the shrinkage at the time of curing. The filler has a smaller degree of shrinkage caused by heat as compared to the resin material, it is possible to reduce the entire degree of shrinkage when the coating liquid 27 is cured to become the reinforcing portion 26 by adding the filler. Examples of the filler can include a particle such as carbon black. Incidentally, when the filler is added, the polymerization reaction of the photocurable resin is interfered as light is blocked by the filler, and thus, it is considered that the curing does not sufficiently proceed. On consideration of such a problem, a thermosetting resin may be further added in the material to form the coating liquid 27 and the reinforcing portion 26.

(Example Relating to Shape of Side Surface of Reinforcing Portion)

In the above-described present embodiment and the respective modified examples, the shape of the side surface

26c, that is, the shape of the side surface 20c of the cover glass 20 may be trimmed by processing the side surface 26c of the reinforcing portion 26 after obtaining the reinforcing portion 26 by curing the coating liquid 27. As described above, the reinforcing portion 26 includes the resin material, and thus, it is easy to process the side surface 20c of the cover glass 20 and obtain a desired shape as compared to a case in which the side surface 20c of the cover glass 20 is made of a tempered glass. In addition, the reduction in strength or generation of microcracks due to the processing is hardly generated. It is possible to employ processing using a polishing machine, for example, as the processing method.

Figure 22A:
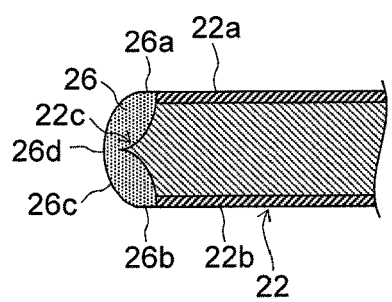
FIG. 22A is a diagram illustrating an example of a processed reinforcing portion.

For example, the side surface 26c of the reinforcing portion 26 may be processed such that both the edge 26ae on the first surface 26a side and the edge 26be on the second surface 26b side of the reinforcing portion 26 are scraped off as illustrated in FIG. 22A. In the example illustrated in FIG. 22A, both a part intersecting with the first surface 26a and a part intersecting with the second surface 26b, in the side surface 26c of the reinforcing portion 26, are processed to have a round surface. Even in this case, it is possible to secure the high external dimensional accuracy in the cover glass 20 based on the above-described coating method using the protective films 81 and 82 when at least a part of a portion which is not processed (hereinafter, referred to also as an unprocessed portion 26d) remains on the side surface 22c. Incidentally, FIG. 22A illustrates the example in which the side surface 26c is processed such that the side surface 26c has the round surface, but the invention is not limited thereto, and the side surface 26c may be processed such that the side surface 26c has an angular surface although not illustrated.

Figure 22B:
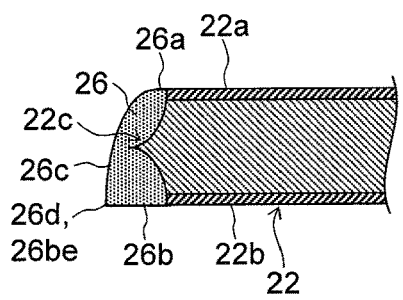
FIG. 22B is a diagram illustrating another example of the processed reinforcing portion.

Besides, the side surface 26c of the reinforcing portion 26 may be processed such that one of the edge 26ae on the first surface 26a side and the edge 26be on the second surface 26b side of the reinforcing portion 26, for example, the edge 26ae on the first surface 26a side is at least scraped off as illustrated in FIG. 22B. In the example illustrated in FIG. 22B, the part intersecting with the first surface 26a in the side surface 26c of the reinforcing portion 26 is processed to have the round surface. In this case, the edge 26be on the second surface 26b side may remain as the unprocessed portion 26d. According to the example illustrated in FIG. 22B, it is possible to give an impression that the first surface 20a side of the cover glass 20 is rounded over a wide region by mainly processing the first surface 26a side of the reinforcing portion 26.

(Modified Example Relating to Position of End Surface of Protective Film)

Figure 23A:
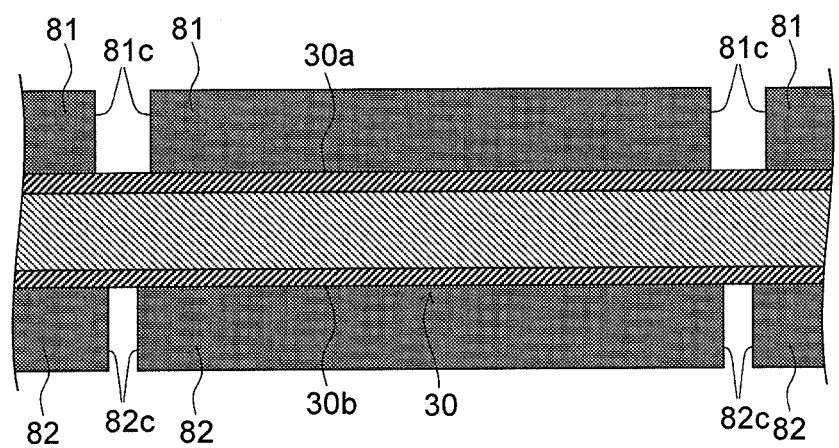
FIG. 23A is a diagram illustrating an example in which an end surface of the first protective film is positioned at an inner side than an end surface of a second protective film.

In the above-described present embodiment and the respective modified examples, the example has been illustrated in which the position of the end surface 81c of the first protective film 81 and the position of the end surface 82c of the second protective film 82 match each other when seen along the normal direction of the base member 30 or the unit base member 22, but the invention is not limited thereto. For example, the end surface 81c of the first protective film 81 provided on the first surface 30a may be positioned at the inner side than the end surface 82c of the second protective film 82 provided on the second surface 30b as illustrated in FIG. 23A. As a result, the clearance between the first protective films 81 is larger than the clearance between the second protective films 82.

Figure 23B:
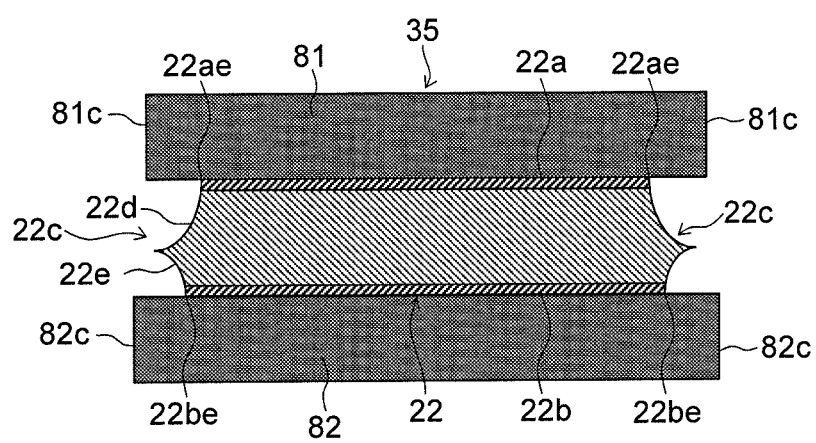
FIG. 23B is a diagram illustrating the unit base member which is obtained by wet etching the base member using the protective film illustrated in FIG. 23A as a resist.

When the base member 30 is wet etched using the first protective film 81 and the second protective film 82 illustrated in FIG. 23A as the resist, the etching proceeds at higher speed on the first surface 30a side than on the second surface 30b side since the clearance between the protective films is larger on the first surface 30a side. As a result, the edge 22ae of the first surface 22a of the unit base member 22 is positioned at the inner side than the edge 22be of the second surface 22b in the unit laminated body 35 obtained through the cutting step using the wet etching as illustrated in FIG. 23B. In addition, the position at which the first side surface 22d on the first surface 22a side and the second side surface 22e on the second surface 22b side are merged becomes a position deviated to the second surface 22b Instead of the middle position between the first surface 22a and the second surface 22b.

Figure 23C:
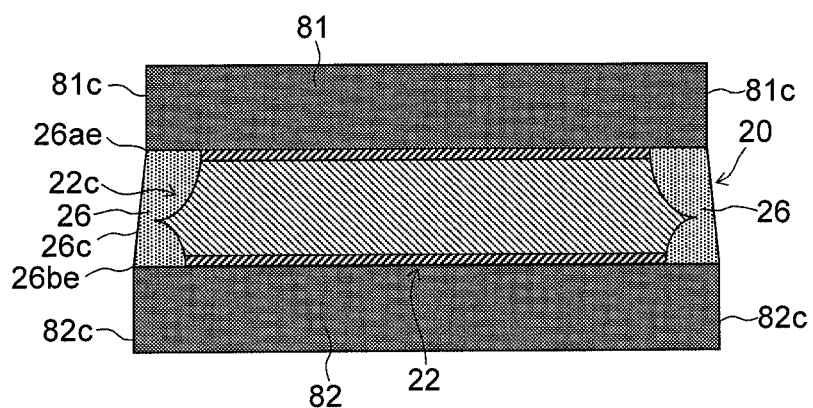
FIG. 23C is a diagram illustrating a cover glass which is obtained by forming the reinforcing portion on a side surface of the unit base member illustrated in FIG. 23B.

FIG. 23C illustrates the reinforcing portion 26 which is formed by applying the coating liquid 27 in the space surrounded by the side surface 22c of the unit base member 22 of the unit laminated body 35, illustrated in FIG. 23B, the first protective film 81, and the second protective film 82, and curing the coating liquid 27. Here, the example is illustrated in which the reinforcing portion 26 is formed such that the edge 26ae of the first surface 26a of the reinforcing portion 26 matches the end surface 81c of the first protective film 81, and the edge 26be of the second surface 26b of the reinforcing portion 26 matches the end surface 82c of the second protective film 82. Since the end surface 81c of the first protective film 81 is positioned at the inner side than the end surface 82c of the second protective film 82 as described above, the edge 26ae of the reinforcing portion 26 is positioned at the inner side than the edge 26be of the reinforcing portion 26.

Figure 23D:
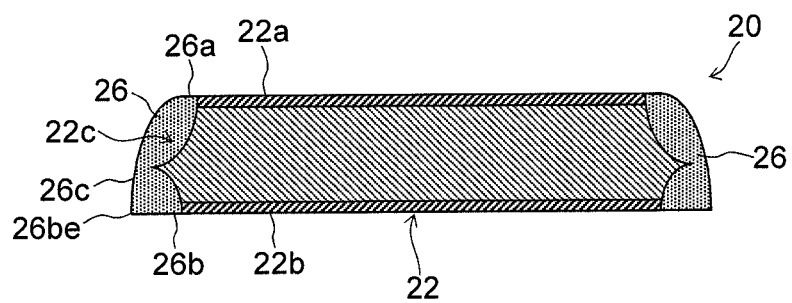
FIG. 23D is a diagram illustrating a cover glass which is obtained by processing a side surface of the reinforcing portion illustrated in FIG. 23C.

FIG. 23D illustrates the cover glass 20, which is obtained by processing the side surface 26c of the reinforcing portion 26 of the cover glass 20 illustrated in FIG. 23C. Here, the example in which the first surface 26a side of the reinforcing portion 26 is mainly processed is illustrated similarly to the case of the above-described example illustrated in FIG. 22B. Here, the edge 26ae of the first surface 26a of the reinforcing portion 26 is positioned at the inner side than the edge 26be of the second surface 26b in the present modified example as described above, and thus, it is possible to more easily obtain the reinforcing portion 26 having a shape in which the first surface 26a is rounded.

(Modified Example of Cutting Method)

Although the method of cutting the base member 30 using the wet etching has been described in the above-described present embodiment, the cutting method is not particularly limited. For example, the base member 30 may be cut using laser. In addition, the base member 30 may be cut with a scribe line as an origin by forming the scribe line on a surface of the base member 30 with a cutter or laser, and thereafter, applying a striking force or a bending stress to the base member 30.

Incidentally, there is a case in which a microcrack is generated around the scribe line in the case of forming the scribe line on the surface of the base member 30. On the contrary, such a microcrack is not generated in the case of cutting the base member 30 using the wet etching, and from this point, the wet etching is more excellent than the cutting method using the scribe line. Incidentally, the side surface 22c of the unit base member 22 and surroundings thereof may be wet etched in order to remove the microcrack generated around the scribe line after cutting the base member 30 with the scribe line as the origin.

(Other Modified Examples)

In the above-described present embodiment, the example has been illustrated in which the protective films 81 and 82 are configured by pasting the sheet of the biaxially-oriented polypropylene or the unstretched polypropylene to the base member 30 via the adhesive layer. However, the method of forming the protective films 81 and 82 is not particularly limited as long as the protective film can serve as a frame at the time of generating the reinforcing portion 26. For example, the protective films 81 and 82 can be provided on the base member 30 by pasting the photosensitive resist film on each of the first surface 30a and the second surface 30b of the base member 30, then, irradiating the photosensitive resist film with light such as the ultraviolet ray using a photomask or the like according to a desired shape, and performing patterning with a developing solution such as an acid liquid, an alkaline liquid, or an organic solvent.

In the present modified example, the external dimensional accuracy of the end surfaces 81c and 82c of the protective films 81 and 82 conforms to the resolution accuracy of the photosensitive resist film for formation of the protective films 81 and 82. Accordingly, it is possible to accurately set the positions of the edges 26ae and 26be of the reinforcing portion 26, that is, the position of the edge of the cover glass 20 even in the present modified example.

In addition, the example in which a so-called diamond pattern is employed as patterns of the sensor electrodes 41 and 42 of the touch panel sensor unit 40 has been illustrated in the above-described present embodiment, but the patterns of the sensor electrodes 41 and 42 are not limited thereto. It is possible to employ the sensor electrodes 41 and 42 having various types of patterns as long as it is possible to detect a touch position with a desired sensitivity or resolution.

In addition, the example in which the transparent conductive material is used to form the sensor electrodes 41 and 42 of the touch panel sensor unit 40 so as to have the translucency has been illustrated in the above-described present embodiment, but the material of the sensor electrodes 41 and 42 is not limited thereto. For example, it is also possible to employ a so-called mesh sensor type which is made of a thin metal wire obtained by disposing a non-transparent conductive material such as a silver alloy or copper in a mesh shape as the sensor electrodes 41 and 42.

Incidentally, although several modified examples with respect to the above-described embodiment have been described, it is obvious that a plurality of modified examples can be combined appropriately, and applied.

EXAMPLES

Next, the present invention will be described more in detail using examples, but the present invention is not limited to the description of the following examples as long as it does not exceed a gist thereof.

Example 1

The cover glass 20, which includes the unit base member 22 and the reinforcing portion 26 provided on the side surface 22c of the unit base member 22, was prepared. A unit base member in which the compressive stress layer 24a is formed at the first surface 22a and the second surface 22b, but the compressive stress layer 24a is not formed at the side surface 22c was used as the unit base member 22. A thickness of the unit base member 22 was 0.7 mm. An acrylic resin-based photocurable resin was used as the material to form the reinforcing portion 26. To be specific, Photolec A-704 manufactured by SEKISUI CHEMICAL CO., LTD. was used. A viscosity of the coating liquid containing the photocurable resin used to be applied on the first surface 26a was adjusted to 1500 mPa·s.

Figure 24:
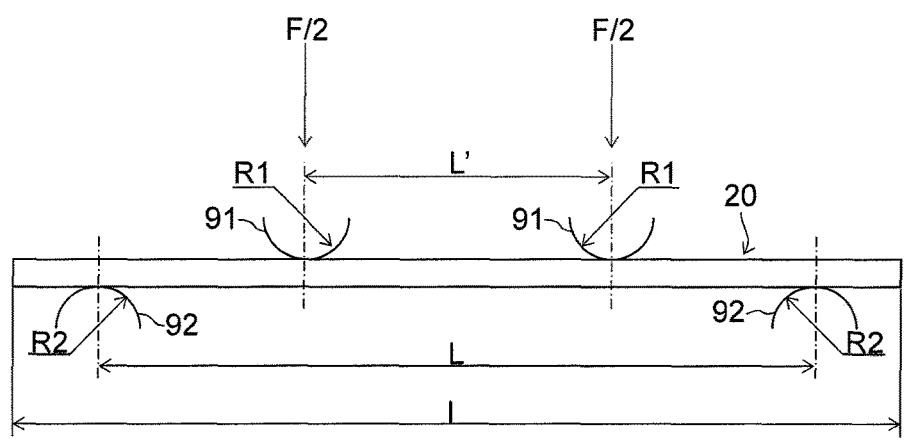
FIG. 24 is a diagram illustrating a measurement device which is used to measure a bending strength of the cover glass.

A bending strength of the cover glass 20 thus manufactured was measured. A four-point bending test method was employed as a measuring method. A combination of a tension/compression tester (for example, AG-I manufactured by SHIMADZU CORPORATION) and a four-point bending test jig manufactured for the four-point bending test was used as the measurement device. The used measurement device is illustrated in FIG. 24. As illustrated in FIG. 24, the measurement device includes a pair of indenters 91 to press the cover glass 20 from one side of the cover glass 20, and a pair of supports 92 to support the cover glass 20 on the other side of the cover glass 20. Rod-like indenter and support extending along the cover glass 20 were used as the indenter 91 and the support 92 although not illustrated in FIG. 24. Each length of the indenter 91 and the support 92 in the depth direction of the paper plane of FIG. 24 was approximately 15 cm. In addition, a distance L' between the pair of indenters 91 was 10 mm, and a distance L between the pair of supports 92 was 30 mm. In addition, a radius R1 of each tip of the pair of indenters 91 was 2.0 mm, and a radius R2 of each tip of the pair of supports 92 was 3.0 mm. In addition, a width I of the cover glass 20 as an object to be measured was approximately 14 cm, a dimension of the cover glass 20 in the depth direction of the paper plane of FIG. 24 was approximately 7 cm, and a thickness of the cover glass 20 was 0.7 mm. Incidentally, positioning of the cover glass 20 as the object to be measured, the indenter 91, and the support 92 was performed with the eyes such that the respective centers thereof match each other.

In the step of measuring the bending strength, the pair of indenters 91 was dropped at indenter displacement speed of 7 mm/mm by applying a load F to the pair of indenters 91 (a load to be applied to the single inner indenter 91 is F/2). Further, the load F at a point in time at which the cover glass 20 was broken was set as a strength of the cover glass 20. As a result, a bending strength of the cover glass 20 according to Example 1 was 1250 MPa. In addition, a scratch such as a crack was not generated on the side surface 20c of the cover glass 20 in a post-process in which printing or the like is performed with respect to the cover glass 20. In addition, when the side surface 20c of the cover glass 20 was shaved using a sandpaper, only the reinforcing portion 26 was shaved, and the scratch such as the crack was not generated.

Incidentally, the element portion 70 including the decorative portion 60, the touch panel sensor unit 40 and the like was provided on the first surface 20a of the cover glass 20 at the time of measuring the bending strength. In addition, an overcoat layer to cover the decorative portion 60 and the touch panel sensor unit 40 was also present.

(Comparative Example 1)

A cover glass which has the same configuration as the case of Example 1 except that the reinforcing portion 26 was not provided was prepared. A bending strength of this cover glass was measured in the same manner as the case of Example 1. As a result, the bending strength was 750 MPa.

REFERENCE SIGNS LIST 10 cover glass-equipped display device
15 display device
20 cover glass
22 unit base member
22a first surface
22b second surface
22c side surface
24a compressive stress layer
24b tensile stress layer
26 reinforcing portion
26a first surface 26b second surface
26c side surface
27 coating liquid
30 base member
35 unit laminated body
40 touch panel sensor unit
60 decorative portion
62 additional decorative portion
70 element portion
81 first protective film
81c end surface
82 second protective film
82c end surface

The invention claimed is:

1. A method of manufacturing a cover glass to be provided on a display device, the method comprising:
   a step of preparing a unit laminated body that includes a unit base member comprised of glass, which includes a first surface, a second surface on an opposite side of the first surface, and a side surface spreading between the first surface and the second surface, and a first protective film provided on the first surface of the unit base member, and a second protective film provided on the second surface;
   a coating step of applying a coating liquid containing a resin material on the side surface of the unit base member; and
   a curing step of curing the coating liquid on the side surface of the unit base member to form a reinforcing portion on the side surface of the unit base member,
   wherein the first protective film is configured to laterally protrude past the first surface of the unit base member, and further, the second protective film is configured to laterally protrude past the second surface of the unit base member, and
   in the coating step, the coating liquid is applied into a space surrounded by the side surface of the unit base member, the first protective film, and the second protective film.

2. The method of manufacturing the cover glass according to claim 1, wherein
   a position of an edge on a first surface of the reinforcing portion, which is formed in the curing step, matches a position of an end surface of the first protective film, and
   a position of an edge on a second surface of the reinforcing portion, which is formed in the curing step, matches a position of an end surface of the second protective film.

3. The method of manufacturing the cover glass according to claim 1, wherein
   an edge on a first surface of the reinforcing portion, which is formed in the curing step, is positioned at an inner side than an end surface of the first protective film, and an edge on a second surface of the reinforcing portion, which is formed in the curing step, is positioned at an inner side than an end surface of the second protective film.

4. The method of manufacturing the cover glass according to claim 1, wherein
   the unit base member includes a compressive stress layer, which is formed at least at the first surface and the second surface, and a tensile stress layer which is positioned between the compressive stress layer at the first surface side and the compressive stress layer at the second surface side.

5. The method of manufacturing the cover glass according to claim 4, wherein
   the tensile stress layer is exposed to the side surface of the unit base member, and
   the reinforcing portion is formed such that the tensile stress layer exposed to the side surface of the unit base member is covered by the reinforcing portion.

6. The method of manufacturing the cover glass according to claim 1, wherein
   the unit base member is obtained by performing a cutting step of cutting a base member comprising a tempered glass.

7. The method of manufacturing the cover glass according to claim 6, further comprising
   a protective film forming step of providing the first protective film and the second protective film in a plurality of predetermined sections on the first surface and the second surface of the base member, the protective film forming step performed prior to the cutting step,
   wherein, in the cutting step, the unit laminated body is obtained by cutting the base member along each clearance of the first protective film and the second protective film provided in each of the sections.

8. The method of manufacturing the cover glass according to claim 7, wherein
   the cutting step includes a step of cutting the base member by wet etching the base member from the first surface side and the second surface side of the base member using the first protective film and the second protective film as a resist.

9. The method of manufacturing the cover glass according to claim 7, further comprising
   an element portion forming step of forming at least a part of element portions including at least any one of a decorative portion and a touch panel sensor unit in the first surface side of the base member.

10. The method of manufacturing the cover glass according to claim 9, wherein
    the element portion forming step is performed prior to the protective film forming step.

* * * * *